United States Patent [19]
Kawamonzen

[11] Patent Number: 6,001,517
[45] Date of Patent: *Dec. 14, 1999

[54] POSITIVE PHOTOSENSITIVE POLYMER COMPOSITION, METHOD OF FORMING A PATTERN AND ELECTRONIC PARTS

[75] Inventor: Yoshiaki Kawamonzen, Kawasaki, Japan

[73] Assignee: Kabushiki Kaisha Toshiba, Kawasaki, Japan

[ * ] Notice: This patent is subject to a terminal disclaimer.

[21] Appl. No.: 08/960,320

[22] Filed: Oct. 29, 1997

[30] Foreign Application Priority Data

Oct. 31, 1996 [JP] Japan .................................. 8-290032

[51] Int. Cl.$^6$ ............................. G03F 7/023; G03F 7/32
[52] U.S. Cl. ........................... 430/18; 430/165; 430/191; 430/192; 430/193; 430/270.1; 430/326; 430/330; 430/919; 430/920
[58] Field of Search ..................... 430/270.1, 189.191, 430/192, 193, 905, 906, 916, 919, 920, 165, 326, 330, 17, 18

[56] References Cited

U.S. PATENT DOCUMENTS

| | | | |
|---|---|---|---|
| 2,859,112 | 11/1958 | Sus et al. | 430/193 |
| 3,650,754 | 3/1972 | Jones | 430/270.1 |
| 3,779,778 | 12/1973 | Smith et al. | 430/270.1 |
| 4,451,551 | 5/1984 | Kataoka et al. | 430/920 |
| 4,758,497 | 7/1988 | Shah et al. | 430/192 |
| 4,789,619 | 12/1988 | Ruckert et al. | 430/270.1 |
| 5,238,784 | 8/1993 | Tokoh et al. | 430/283.1 |
| 5,348,835 | 9/1994 | Oba et al. | 430/192 |
| 5,449,584 | 9/1995 | Banba et al. | 430/192 |
| 5,518,860 | 5/1996 | Nikura et al. | 430/191 |
| 5,756,650 | 5/1998 | Kawamonzen et al. | 430/192 |

OTHER PUBLICATIONS

Masayuki Oba. "Effect of Curing Accelerators on Thermal Imidization of Polyamic Acids at Low Temperature", Journal of Polymer Science: Polymer Chemistry, vol. 34, 1996, pp. 651–658.

Masayuki Oba. "Effect of Cure Accelerator on Imidization of Polyamic acid at Low Temperature", Polymer Reprints of Japan, vol. 43, No. 7, 1994, pp. 2087–2088.

Masayuki Oba, et al., "Synthesis and Evaluation of Positive–Acting Photosensitive Polyimides with Phenol Moiety", Journal of Applied Science, vol. 58, 1995, pp. 1535–1542.

*Primary Examiner*—John S. Chu
*Attorney, Agent, or Firm*—Oblon, Spivak, McClelland, Maier & Neustadt, P.C.

[57] ABSTRACT

A positive photosensitive polymer composition, which comprises a thermosetting polymer precursor which can be cured through cyclodehydration upon heating, and a photosensitive cure accelerator which can be inactivated of its cure accelerating property by irradiation of light.

20 Claims, 1 Drawing Sheet

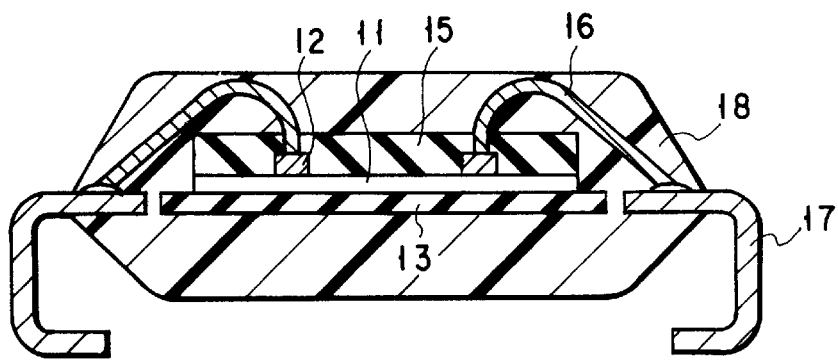
F I G. 1
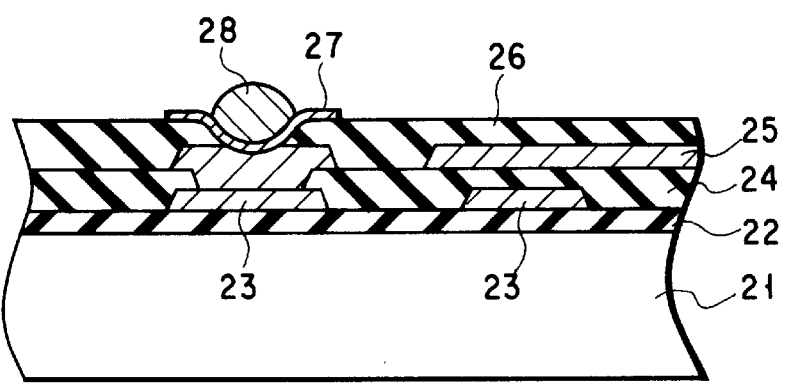
F I G. 2
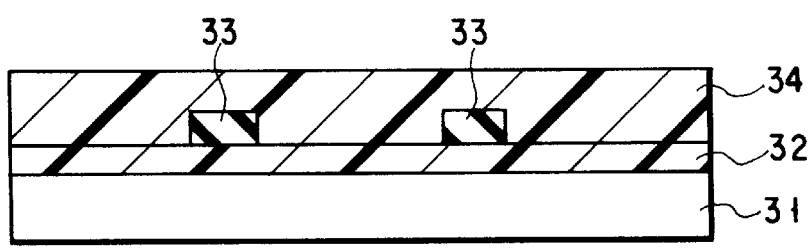
F I G. 3
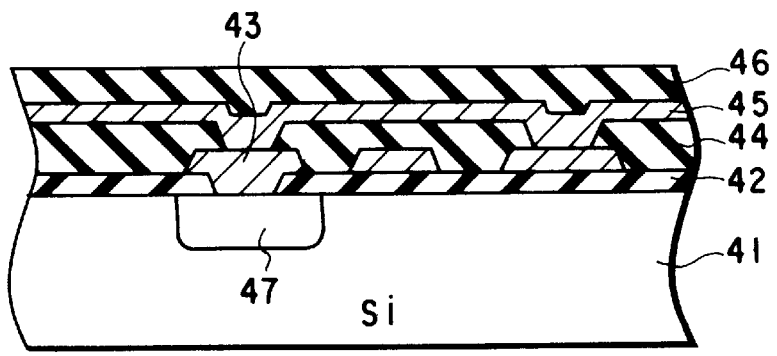
F I G. 4

POSITIVE PHOTOSENSITIVE POLYMER COMPOSITION, METHOD OF FORMING A PATTERN AND ELECTRONIC PARTS

BACKGROUND OF THE INVENTION

This invention relates to a positive photosensitive polymer composition which is suited for use in the formation of pattern of insulation film, passivation film, α-ray shielding film, optical waveguide and the like, which are employed in various electronic parts. This invention relates also to a method of forming a pattern by making use of the aforementioned positive photosensitive polymer composition, and to electronic parts provided with a pattern of the aforementioned positive photosensitive polymer composition as an insulation member or as a passivation member.

In the ordinary semiconductor device having semiconductor elements formed on the surface of its substrate, the surface of substrate is generally covered with a protective film called a passivation film for the purpose of protecting the semiconductor elements from any influence of the external environment thereby improving the reliability of the semiconductor device. As a material for this passivation film, a polyimide resin is extensively employed in view of its excellent properties such as electric properties (e.g. insulating characteristics), radiation resistance, environmental stability and heat resistance. Furthermore, this polyimide resin is widely employed in a semiconductor device as an α-ray shielding film, or as an interlayer insulating film for a multilayered wiring structure or for a multilayered element structure (a multichip module).

This polyimide resin can be easily formed into a film from polyamic acid which is a precursor for the polyimide. Namely, a varnish of polyamic acid is coated on the surface of a predetermined substrate and then the coated layer is heated to form a film of polyamic acid, which is then heat-treated at a high temperature thereby to cause a cyclodehydration reaction of the polyamic acid to take place, thus curing the polyamic acid film and forming a polyimide film. It is possible, with the employment of this method, to easily form a film of polyimide in spite of the fact that polyimide can be hardly worked since it is not or hardly soluble to most of organic solvents and is high in softening point. Therefore, the aforementioned method has been widely adopted in the formation of polyimide film.

Meanwhile, in the manufacture of a semiconductor device, various workings, for example, for forming a through-hole in a multilayered wiring structure or for forming a pad for effecting an electric connection with an external lead are required. In order to carry out these workings, a polyimide film formed as a passivation film or an interlayer insulating film as explained above is required to be patterned thereby to form holes or grooves of predetermined patterns. Generally, the patterning of polyimide film is performed by making use of PEP (photo-engraving process) using a photoresist. Namely, after a polyimide film is formed on the surface of a semiconductor substrate bearing a semiconductor element thereon in the method as mentioned above, a photoresist film is further formed on the surface of the polyimide film and then subjected to a light exposure process followed by a development process thereby forming a resist pattern. Then, the underlying polyimide film is selectively etched by making use of this resist pattern as an etching mask thereby to form a polyimide passivation film or interlayer insulating film having a prescribed pattern.

However, the aforementioned method of forming a polyimide pattern requires two independent steps, i.e. a step of forming a polyimide film and a step of the PEP, making the method troublesome to carry out.

With a view to solve the aforementioned drawback in carrying out the method, a method of patterning a polyimide film without employing the PEP has been demanded. In response to such a demand, a resin composition comprising a polyimide precursor has been proposed.

For example, Japanese Patent Unexamined Publication S/49-115541 discloses a polyamic ester which can be obtained through a reaction between a diamino compound and tetra-carboxylic diester dichloride. Namely, according to this prior art, instead of using tetra-carboxylic dianhydride which is commonly employed in the synthesis of polyamic acid or a polyimide precursor, tetra-carboxylic diester dichloride wherein a photopolymerizable group is introduced through an ester linkage is employed. This polyamic ester exhibits a photosensitivity of negative type so that an exposed portion irradiated with light is insolubilized against a developing solution. Therefore, it is possible to carry out a patterning in the course of forming a polyimide film without requiring the step of the conventional PEP whereby to obtain a patterned polyimide film.

However, not only the process of synthesizing tetra-carboxylic diester dichloride having a photo-polymerizable group, which is a raw material for the polyamic ester, but also the process of synthesizing the polyamic ester are very complicated. Moreover, the end resin product to be obtained unavoidably takes up chlorine ions as an impurity. Additionally, since an organic solvent is employed as a developing solution in the process of developing a polyamic ester film, a large amount of organic solvent is required in the manufacturing line, which is undesirable in viewpoints of safety, sanitation and environment. Furthermore, a swelling of the polyimide film pattern to be obtained may be caused due to the development with an organic solvent, thereby deteriorating the resolution of pattern.

Further, Japanese Patent Publication S/59-52822 discloses, as a photosensitive resin composition of negative type as in the case of aforementioned prior art, a heat resistant photosensitive material containing a compound which has a carbon-carbon double bond and amino group and is dimerizable or polymerizable by an actinic radiation. However, this photosensitive material is defective in that, when it is employed as a passivation film for a resin-encapsulated semiconductor device, it is poor in adhesivity to a semiconductor substrate, to a passivation film formed of an inorganic material for protecting the surface of substrate, or to a sealing resin. Therefore, the employment of this photosensitive material may invite a problem that the reliability of semiconductor device to be obtained would be deteriorated. Additionally, this photosensitive material requires as in the case of the aforementioned polyamic ester the employment of an organic solvent as a developing solution, which is undesirable in viewpoint of safety.

Further, Japanese Patent Unexamined Publication S/60-6365 discloses a photosensitive resin composition wherein an (N,N-dialkylamino)alkyl methacrylate is attached as a salt to the carboxylic group of polyamic acid. However, this photosensitive resin composition is defective in that the solubility thereof to a solvent to be used is poor.

On the other hand, Japanese Patent Unexamined Publication S/62-145240 discloses a polymer having an isoimide structure. This polymer is of positive type photosensitivity wherein, contrary to the aforementioned composition, the exposed portion irradiated with light is made soluble to a developing agent. Since this polymer is of positive type photosensitivity, this polymer can be developed with an alkaline developing solution. However, this polymer is defective in that it is poor in heat resistance and in photosensitivity, so that it cannot be satisfactorily employed as a passivation film in a semiconductor device.

There are known other examples of a photosensitive resin composition exhibiting a positive type photosensitivity as mentioned above. For example, Japanese Patent Unexamined Publication S/64-60630 discloses a composition comprising a solvent-soluble polyimide that can be synthesized through a reaction between a diamine compound having a hydroxy group-substituted aromatic ring and an acid anhydride, to which an o-quinone diazide compound is added as a photosensitive agent. Japanese Patent Unexamined Publications S/52-13315 and S/62-135824 disclose a similar photosensitive resin composition comprising quinone diazide as a photosensitive agent. Japanese Patent Unexamined Publication S/60-37550 discloses a photosensitive resin composition comprising o-nitrobenzyl ester group as a photosensitive agent.

Since these photosensitive resin compositions are capable of being developed with an alkaline developing solution, any problems accompanying with the employment of an organic solvent as in the case of the aforementioned negative type photosensitive resin compositions can be overcome. However, these photosensitive resin compositions are defective in that a difference in solubility to an alkaline developing solution between a light-exposed portion and a light-unexposed portion is not large enough so that it is difficult to form a fine pattern with high resolution. Furthermore, since a polymer constituting a main component of these resin compositions is structurally restricted, the adhesivity thereof to a silicon wafer, a glass substrate, a ceramic substrate, a sealing resin and a metal which are usually employed in various semiconductor devices is poor.

As mentioned above, although the polyimide resin is excellent in electric properties, radiation resistance and heat resistance thus making it suitable for use as a passivation film or as an interlayer insulating film for a semiconductor device, no one has succeeded up to date to develop a photosensitive resin composition which enables to obtain a fine polyimide film pattern exhibiting an excellent adhesion to a substrate by way of a safe and simple manufacturing process.

BRIEF SUMMARY OF THE INVENTION

This invention has been accomplished in view of the aforementioned problems, and therefore the object of this invention is to solve the drawbacks of the prior art and to provide a positive photosensitive polymer composition which enables to form a polyimide film pattern without requiring the employment of a photoresist.

Other objects of this invention are to provide a method of forming a pattern with the employment of the aforementioned positive photosensitive polymer composition and to provide electronic parts provided with a patterned polymer film formed from the aforementioned positive photosensitive polymer composition.

According to this invention, there is provided a positive photosensitive polymer composition, which comprises a thermosetting polymer precursor which can be cured through cyclodehydration upon heating, and a photosensitive cure accelerator which can be inactivated of its cure accelerating property by irradiation of light.

According to this invention, there is further provided a method of forming a pattern, which comprises the steps of;

coating the aforementioned positive photosensitive polymer composition on a surface of a substrate; forming a resin layer by heat-drying the coated photosensitive polymer composition at a temperature of not more than 180° C.; irradiating light onto a predetermined region of the resin layer; heat-treating the resin layer after the light-irradiating step at a temperature ranging from 50 to 200 C.; and developing the heat-treated resin layer by dissolving and removing a portion of the resin layer which is exposed to the light by making use of a developing solution.

According to this invention, there is further provided electronic parts, which is provided with a polymer film functioning as an insulating film, a passivation film, an optical film or a liquid crystal orienting film, the polymer film being formed through a patterning of a layer containing the aforementioned positive photosensitive polymer composition.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view of a semiconductor element provided with a passivation film which has been obtained by patterning a film formed of a photosensitive polymer composition according to this invention;

FIG. 2 is a cross-sectional view of a multi-chip module provided with an interlayer insulating film which has been obtained by patterning a film formed of a photosensitive polymer composition according to this invention;

FIG. 3 is a cross-sectional view of an optical waveguide provided with a polymer core layer which has been obtained by patterning a film formed of a photosensitive polymer composition according to this invention; and FIG. 4 is a cross-sectional view of a semiconductor element having a multilayered wiring structure comprising an interlayer insulating film which has been obtained by patterning a film formed of a photosensitive polymer composition according to this invention.

DETAILED DESCRIPTION OF THE INVENTION

This invention will be further explained as follows.

As for the examples of the thermosetting polymer precursor which can be cured through cyclodehydration upon heating and which can be employed in a positive photosensitive polymer composition of this invention, a polyimide precursor, polybenzoxazole precursor, polybenzothiazole precursor, polybenzimidazole precursor, polybenzoquinazolinedione precursor and polybenzoxadiazole precursor are useful. Particularly preferable examples among these thermosetting polymer precursors are polyimide precursors (polyamic acid) having a repeating unit represented by the following general formula (1).

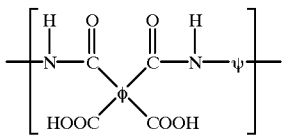

(1)

wherein φ is a quadrivalent organic group; and φ is a bivalent organic group.

The polyamic acid represented by the aforementioned general formula (1) can be synthesized through a reaction in an organic solvent between a tetracarboxylic dianhydride represented by the following general formula (4) and a diamine compound represented by the following general formula (5).

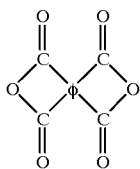

(4)

wherein φ is a quadrivalent organic group.

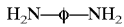

(5)

wherein φ is a bivalent organic group.

The quadrivalent organic group φ in the tetracarboxylic dianhydride represented by the general formula (4) may be selected from the group consisting of an aliphatic hydrocarbon group, an alicyclic hydrocarbon group, an aromatic hydrocarbon group, a heterocyclic group each having 1 to 30 carbon atoms and a polycyclic compound group wherein an aliphatic hydrocarbon group, an alicyclic hydrocarbon group, an aromatic hydrocarbon group or a heterocyclic group is mutually linked to each other directly or via a crosslinking group.

Examples of tetracarboxylic dianhydride represented by the general formula (4) are pyromellitic dianhydride, 3-fluoropyromellitic dianhydride, 3,6-difluoropyromellitic dianhydride, 3-(trifluoromethyl) pyromellitic dianhydride, 3,6-bis(trifluoromethyl)pyromellitic dianhydride, 1,2,3,4-benzenetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 3,3'',4,4''-terphenyltetracarboxylic dianhydride, 3,3''',4,4'''-quaterphenyltetracarboxylic dianhydride, 3,3'''',4,4''''-quinquephenyltetracarboxylic dianhydride, 2,2',3,3'-biphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4,-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl]benzene dianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2-bis[3-(3,4-dicarboxyphenoxy)phenyl]propane dianhydride, 2,2-bis[4-(3,4-dicarboxyphenoxy)phenyl]propane dianhydride, 2,2-bis[3-(3,4-dicarboxyphenoxy)phenyl]-1,1,1,3,3,3-hexafluoropropane dianhydride, 2,2-bis[4-(3,4-dicarboxyphenoxy)phenyl]-1,1,1,3,3,3-hexafluoropropane dianhydride, bis(3,4-dicarboxyphenoxy)dimethylsilane dianhydride, 1,3-bis(3,4-dicarboxyphenyl)-1,1,3,3-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, ethylene tetracarboxylic dianhydride, 1,2,3,4-butanetetracarboxylic dianhydride, 1,2,3,4-cyclobutanetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic) dianhydride, methylene-4,4'-bis(cyclohexane-1,2-dicarboxylic) dianhydride, 1,2-ethylene-4,4'-bis(cyclohexane-1,2-dicarboxylic) dianhydride, 1,1-ethylidene-4,4'-bis(cyclohexane-1,2-dicarboxylic) dianhydride, 2,2-propylidene-4,4'-bis(cyclohexane-1,2-dicarboxylic) dianhydride, 1,1,1,3,3,3-hexafluoro-2,2-propylidene-4,4'-bis(cyclohexane-1,2-dicarboxylic) dianhydride, oxy-4,4'-bis(cyclohexane-1,2-dicarboxylic) dianhydride, thio-4,4'-bis(cyclohexane-1,2-dicarboxylic) dianhydride, sulfonyl-4,41-bis(cyclohexane-1,2-dicarboxylic) dianhydride, 2,2'-difluoro-3,3',4,4'-biphenyltetracarboxylic dianhydride, 5,5,-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4'-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxylic dianhydride, oxy-4,4'-bis(3-fluorophthalic) dianhydride, oxy-4,4'-bis(5-fluorophthalic) dianhydride, oxy-4,4'-bis(6-fluorophthalic) dianhydride, oxy-4,4'-bis(3,5,6-trifluorophthalic) dianhydride, oxy-4,4'-bis[3-(trifluoromethyl) phthalic] dianhydride, oxy-4,4'-bis[5-(trifluoromethyl) phthalic] dianhydride, oxy-4,4'-bis[6-(trifluoromethyl) phthalic] dianhydride, oxy-4,4'-bis[3,5-bis(trifluoromethyi) phthalic] dianhydride, oxy-4,4'-bis[3,6-bis(trifluoromethyl) phthalic] dianhydride, oxy-4,4'-bis[5,6-bis(trifluoromethyl) phthalic] dianhydride, oxy-4,4 '-bis[3,5,6-tris(trifluoromethyl) phthalic] dianhydride, sulfonyl-4,4'-bis(3-fluorophthalic) dianhydride, sulfonyl-4,4'-bis(5-fluorophthalic) dianhydride, sulfonyl-4,4'-bis(6- fluorophthalic) dianhydride, sulfonyl-4,4'-bis(3,5,6-trifluorophthalic) dianhydride, sulfonyl-4,4'-bis[3-(trifluoromethyl) phthalic] dianhydride, sulfonyl-4,4'-bis[5-(trifluoromethyl) phthalic] dianhydride, sulfonyl-4,4'-bis[6-(trifluoromethyl) phthalic] dianhydride, sulfonyl-4,4'-bis[3,5-bis(trifluoromethyl) phthalic] dianhydride, sulfonyl-4,4'-bis[3,6-bis(trifluoromethyl) phthalic] dianhydride, sulfonyl-4,4'-bis[5,6-bis(trifluoromethyl) phthalic] dianhydride, sulfonyl-4,4'-bis[3,5,6-tris(trifluoromethyl) phthalic] dianhydride, 1,1,1,3,3,3-hexafluoro-2,2-propylidene-4,4'-bis(3-fluorophthalic) dianhydride, 1,1,1,3,3,3-hexafluoro-2,2-propylidene-4,4'-bis(5-fluorophthalic) dianhydride, 1,1,1,3,3,3-hexafluoro-2,2-propylidene-4-4'-bis(6-fluorophthalic) dianhydride, 1,1,1,3,3,3-hexafluoro-2,2-propylidene-4,4'-bis(3,5,6-trifluorophthalic) dianhydride, 1,1,1,3,3,3-hexafluoro-2,2-propylidene-4,4'-bis[3-(trifluoromethyl) phthalic] dianhydride, 1,1,1,3,3,3-hexafluoro-2,2-propylidene-4,4'-bis[5-(trifluoromethyl) phthalic] dianhydride, 1,1,1,3,3,3-hexafluoro-2,2-propylidene-4,4'-bis[6-(trifluoromethyl) phthalic] dianhydride, 1,1,1,3,3,3-hexafluoro-2,2-propylidene-4,4'-bis[3,5-bis(trifluoromethyl) phthalic] dianhydride, 1,1,1,3,3,3-hexafluoro-2,2-propylidene-4,4'-bis[3,6-bis(trifluoromethyl) phthalic] dianhydride, 1,1,1,3,3,3-hexafluoro-2,2-propylidene-4,4'-bis[5,6-bis(trifluoromethyl) phthalic] dianhydride, 1,1,1,3,3,3-hexafluoro-2,2-propylidene-4,4'-bis[3,5,6-tris(trifluoromethyl) phthalic] dianhydride, 9-phenyl-9-(trifluoromethyl)xanthene-2,3,6,7-tetracarboxylic dianhydride, 9,9-bis(trifluoromethyl)xanthene-2,3,6,7-tetracarboxylic dianhydride, and bicyclo[2,2,2]oct-7-ene-2,3,5,6-tetracarboxylic dianhydride.

These tetracarboxylic dianhydrides may be used singly or in combination of two or more kinds. The content of tetracarboxylic dianhydride should be preferably 0.8 molar equivalent or more, more preferably 0.9 molar equivalent (molar fraction) or more based on the total acid anhydride components. The reason for this is that if the content of tetracarboxylic dianhydride is less than this lower limit, the heat resistance of the polyimide to be obtained would be deteriorated.

The bivalent organic group φ in the diamine compound represented by the general formula (5) may be selected from the group consisting of an aliphatic hydrocarbon group, an alicyclic hydrocarbon group, an aromatic hydrocarbon group, a heterocyclic group each having 1 to 30 carbon atoms and a polycyclic compound group wherein an aliphatic hydrocarbon group, an alicyclic hydrocarbon group, an aromatic hydrocarbon group or a heterocyclic group is mutually linked to each other directly or via a crosslinking group.

Examples of diamine compound represented by the general formula (5) are 1,2-phenylenediamine, 1,3-phenylenediamine, 1,4-phenylenediamine, 3,3'-diaminobiphenyl, 3,4'-diaminobiphenyl, 4,4'-diaminobiphenyl, 3,3"-diaminoterphenyl, 4,4"'-diaminoterphenyl, 3,3'''-diaminoquaterphenyl, 4,4'''-diaminoquaterphenyl, 3,3''''-diaminoquinquephenyl, 4,4''''-diaminoquinquephenyl, oxy-3,3'-dianiline, oxy-4,4'-dianiline, thio-3,3'-dianiline, thio-4,4'-dianiline, sulfonyl-3,3'-dianiline, sulfonyl-4,4'-dianiline, methylene-3,3'-dianiline, methylene-4,4'-dianiline, 1,2-ethylene-3,3'-dianiline, 1,2-ethylene-4,4'-dianiline, 1,1-ethylidene-3,3'-dianiline, 1,1-ethylidene-4,4'-dianiline, 1,3-propylene-3,3'-dianiline, 1,3-propylene-4,4'-dianiline, 2,2-propylidene-3,3'-dianiline, 2,2-propylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,2,2,3,3-hexafluoro-1,3-propylene-3,3'-dianiline, 1,1,2,2,3,3-hexafluoro-1,3-propylene-4,4'-dianiline, 1,3-bis(3-aminophenoxy)benzene, 1,3-bis(4-aminophenoxy)benzene, 1,3-bis(3-aminophenylthio)benzene, 1,3-bis(4-aminophenylthio)benzene, 1,3-bis(3-aminophenylsulfonyl)benzene, 1,3-bis(4-aminophenylsulfonyl)benzene, 1,3-bis[2-(3-aminophenyl)-2-propyl]benzene, 1,3-bis[2-(4-aminophenyl)-2-propyl]benzene, 4,4'-bis(3-aminophenoxy)biphenyl, 4,4'-bis(4-aminophenoxy)biphenyl, bis[4-(3-aminophenoxy)phenyl] ether, bis[4-(4-aminophenoxy)phenyl] ether, bis[4-(3-aminophenoxy)phenyl] sulfone, bis[4-(4-aminophenoxy)phenyl] sulfone, 2,2-bis[4-(3-aminophenoxy)phenyl] propane, 2,2-bis[4-(4-aminophenoxy)phenyl] propane, 1,3-bis[2-(3-aminophenyl)-1,1,1,3,3,3-hexafluoro-2-propyl]benzene, 1,3-bis[2-(4-aminophenyl)-1,1,1,3,3,3-hexafluoro-2-propyl]benzene, 1,4-bis(3-aminophenoxy)benzene, 1,4-bis(4-aminophenoxy)benzene, 1,4-bis(3-aminophenylthio)benzene, 1,4-bis(4-aminophenylthio)benzene, 1,4-bis(3-aminophenylsulfonyl)benzene, 1,4-bis(4-aminophenylsulfonyl)benzene, 1,4-bis[2-(3-aminophenyl)-2-propyl]benzene, 1,4-bis[2-(4-aminophenyl)-2-propyl]benzene, 1,4-bis[2-(3-aminophenyl)-1,1,1,3,3,3-hexafluoro-2-propyl]benzene, 1,4-bis[2-(4-aminophenyl)-1,1,1,3,3,3-hexafluoro-2-propyl]benzene, 2,2-bis[4-(3-aminophenoxy)phenyl-1,1,1,3,3,3-hexafluoropropane, 2,2-bis[4-(4-aminophenoxy)phenyl-1,1,1,3,3,3-hexafluoropropane, 5-fluoro-1,3-phenylenediamine, 2-fluoro-1,4-phenylenediamine, 2,5-difluoro-1,4-phenylenediamine, 2,4,5,6-hexafluoro-1,3-phenylenediamine, 2,3,5,6-hexafluoro-1,4-phenylenediamine, 3,3'-diamino-5,5'-difluorobiphenyl, 4,4'-diamino-2,2'-difluorobiphenyl, 4,4'-diamino-3,3'-difluorobiphenyl, 3,3'-diamino-2,2',4,4',5,5',6,6'-octafluorobiphenyl, 4,4'-diamino-2,2',3,3',5,5',6,6'-octafluorobiphenyl, oxy-5,5'-bis(3-fluoroaniline), oxy-4,4'-bis(2-fluoroaniline), oxy-4,4'-bis(3-fluoroaniline), sulfonyl-5,5'-bis(3-fluoroaniline), sulfonyl-4,4'-bis(2-fluoroaniline), sulfonyl-4,4'-bis(3-fluoroaniline), 1,3-bis(3-aminophenoxy)-5-fluorobenzene, 1,3-bis(3-amino-5-fluorophenoxy)benzene, 1,3-bis(3-amino-5-fluorophenoxy)-5-fluorobenzene, 5-trifluoromethyl-1,3-phenylenediamine, 2-trifluoromethyl-1,4-phenylenediamine, 2,5-bis(trifluoromethyl)-1,4-phenylenediamine, 2,2'-bis(trifluoromethyl)-4,4'-diaminobiphenyl, 3,3'-bis(trifluoromethyl)-4,4'-diaminobiphenyl, oxy-5,5'-bis[3-(trifluoromethyl) aniline], oxy-4,4'-bis[2-(trifluoromethyl) aniline], oxy-4,4'-bis[3-(trifluoromethyl) aniline], sulfonyl-5,5'-bis[3-(trifluoromethyl) aniline], sulfonyl-4,4'-bis[2-(trifluoromethyl) aniline], sulfonyl-4,4'-bis[3-(trifluoromethyl) aniline], 1,3-bis(3-aminophenoxy)-5-(trifluoromethyl)benzene, 1,3-bis[3-amino-5-(trifluoromethyl) phenoxy] benzene, 1,3-bis[3-amino-5-(trifluoromethyl) phenoxy]-5-(trifluoromethyl)benzene, 3,3'-bis(trifluoromethyl)-5,5'-diaminobiphenyl, bis(3-aminophenoxy) dimethylsilane, bis(4-aminophenoxy) dimethylsilane, 1,3-bis(3-aminophenyl)-1,1,3,3-tetramethyldisiloxane, 1,3-bis(4-aminophenyl)-1,1,3,3-tetramethyldisiloxane, methanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,2-bis(3-aminopropoxy) ethane, 1,3-diaminocyclohexane, 1,4-diaminocyclohexane, bis(3-aminocyclohexyl) methane, bis(4-aminocyclohexyl) methane, 1,2-bis(3-aminocyclohexyl) ethane, 1,2-bis(4- aminocyclohexyl) ethane, 2,2-bis(3-aminocyclohexyl) propane, 2,2-bis(4-aminocyclohexyl) propane, bis(3-aminocyclohexyl) ether, bis(4-aminocyclohexyl) ether, bis (3-aminocyclohexyl)sulfone, bis(4-aminocyclohexyl) sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine, 1,4-xylylenediamine, 1,8-diaminonaphthalene, 2,7-diaminonaphthalene, 2,6-diaminonaphthalene, 2,5-diaminopyridine, 2,6-diaminopyridine, 2,5-diaminopyrazine, 2,4-diamino-s-triazine, 1,3-bis (aminomethyl) cyclohexane, 1,4-bis(aminomethyl) cyclohexane, 1,4-bis(aminopropyldimethylsilyl) benzene, and 1,3-bis(3-aminopropyl)-1,1,3,3-tetraphenyldisiloxane.

These diamine compounds may be used singly or in combination of two or more kinds. The content of diamine compound should be preferably 0.8 molar equivalent or more, more preferably 0.9 molar equivalent or more based on the total amine compound components. The reason for this is that if the content of diamine compound is less than this lower limit, the heat resistance of the polyimide to be obtained would be deteriorated.

The photosensitive polymer composition of this invention may contain, in addition to a diamine compound represented by the aforementioned general formula (5), a diamine compound represented by the following general formula (6), i.e. a bis(aminoalkyl)peralkylpolysiloxane compound.

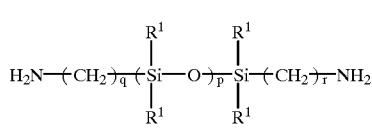

(6)

wherein $R^1$s may be the same or different and are individually alkyl group having 1 to 5 carbon atoms; q and r are integers ranging from 1 to 10; and p is a positive integer.

Examples of a bis(aminoalkyl)peralkylpolysiloxane compound represented by the aforementioned general formula (6) are 1,3-bis(aminomethyl)-1,1,3,3-tetramethyldisiloxane, 1,3-bis(2-aminoethyl)-1,1,3,3-tetramethyldisiloxane, 1,3-bis(3-aminopropyl)-1,1,3,3-tetramethyldisiloxane, 1,3-bis (4-aminobutyl)-1,1,3,3-tetramethyldisiloxane, 1,3-bis(5-aminopentyl)-1,1,3,3-tetramethyldisiloxane, 1,3-bis(6-aminohexyl)-1,1,3,3-tetramethyldisiloxane, 1,3-bis(7-aminoheptyl)-1,1,3,3-tetramethyldisiloxane, 1,3-bis(8-aminooctyl)-1,1,3,3-tetramethyldisiloxane, 1,3-bis(10-aminodecyl)-1,1,3,3-tetramethyldisiloxane, 1,5-bis(3-aminopropyl)-1,1,3,3,5,5-hexamethyltrisiloxane, 1,7-bis(3-aminopropyl)-1,1,3,3,5,5,7,7-octamethyltetrasiloxane, 1,11-bis(3-aminopropyl)-1,1,3,3,5,5,7,7,9,9,11,11-dodecamethylhexasiloxane, 1,15-bis(3-aminopropyl)-1,1,3, 3,5,5,7,7,9,9,11,11,13,13,15,15-hexadecamethyloctasiloxane, and 1,19-bis(3-aminopropyl)-1,1,3,3,5,5,7,7,9,9,11,11,13,13,15,15,17,17,19,19-eicosamethyldecasiloxane.

The addition of this bis(aminoalkyl)peralkylpolysiloxane compound represented by the aforementioned general formula (6) is advantageous in improving the adhesion or bonding properties of polyimide resin to a glass substrate or a semiconductor substrate such as a silicon substrate. However, if the content of the bis(aminoalkyl) peralkylpolysiloxane compound is excessive, the heat resistance of polyimide resin may be deteriorated. Therefore, the content of the bis(aminoalkyl)peralkylpolysiloxane compound should preferably be in the range of 0.02 to 0.2 molar equivalent, more preferably be in the range 0.05 to 0.15 molar equivalent based on the total of diamine components.

The photosensitive polymer composition of this invention may also contain, for the purpose of controlling the polymerization degree of polyamic acid, a dicarboxylic anhydride or a monoamine compound each functioning as a polymerization regulator.

Examples of such a dicarboxylic anhydride are maleic anhydride, citraconic anhydride, dimethylmaleic anhydride, ethylmaleic anhydride, diethylmaleic anhydride, propylmaleic anhydride, butylmaleic anhydride, chloromaleic anhydride, dichloromaleic anhydride, bromomaleic anhydride, dibromomaleic anhydride, fluoromaleic anhydride, difluoromaleic anhydride, trifluoromethylmaleic anhydride, bis(trifluoromethyl)maleic anhydride, cyclobutanedicarboxylic anhydride, cyclopentanedicarboxylic anhydride, cyclohexanedicarboxylic anhydride, tetrahydrophthalic anhydride, endomethylenetetrahydrophthalic anhydride, methyltetrahydrophthalic anhydride, methylendomethylenetetrahydrophthalic anhydride, phthalic anhydride, methylphthalic anhydride, ethylphthalic anhydride, dimethylphthalic anhydride, fluorophthalic anhydride, difluorophthalic anhydride, chlorophthalic anhydride, dichlorophthalic anhydride, bromophthalic anhydride, dibromophthalic anhydride, nitrophthalic anhydride, 2,3-benzophenonedicarboxylic anhydride, 3,4-benzophenonedicarboxylic anhydride, 3-phenoxyphthalic anhydride, 4-phenoxyphthalic anhydride, 3-(phenylsulfonyl) phthalic anhydride, 4-(phenylsulfonyl) phthalic anhydride, 2,3-biphenyldicarboxylic anhydride, 3,4-biphenyldicarboxylic anhydride, 1,2-naphthalenedicarboxylic anhydride, 2,3-naphthalenedicarboxylic anhydride, 1,8-naphthalenedicarboxylic anhydride, 1,2-anthracenedicarboxylic anhydride, 2,3-anthracenedicarboxylic anhydride, 1,9-anthracenedicarboxylic anhydride, 2,3-pyridinedicarboxylic anhydride, 3,4-pyridinedicarboxylic anhydride, succinic anhydride, and nadic anhydride.

Examples of the monoamine compound are methylamine, ethylamine, propylamine, butylamine, pentylamine, hexylamine, heptylamine, octylamine, 1-(3-aminopropyl)-1, 1,3,3,3-pentamethylsiloxane, vinylamine, allylamine, glycine, alanine, aminobutyric acid, valine, norvaline, isovaline, leucine, norleucine, isoleucine, glutamine, glutamic acid, tryptophan, aminocrotonic acid, aminoacetonitrile, aminopropionitrile, aminocrotononitrile, cyclopropylamine, cyclobutylamine, cyclopentylamine, cyclohexylamine, cycloheptylamine, cyclooctylamine, aminoadamantane, aminobenzocyclobutane, aminocaprolactam, aniline, chloroaniline, dichloroaniline, bromoaniline, dibromoaniline, fluoroaniline, difluoroaniline, nitroaniline, dinitroaniline, toluidine, xylidine, ethylaniline, anisidine, phenetidine, aminoacetanilide, aminoacetophenone, aminobenzoic acid, aminobenzaldehyde, aminobenzonitrile, aminophthalonitrile, aminobenzotrifluoride, aminostyrene, aminostilbene, aminoazobenzene, aminodiphenyl ether, aminodiphenylsulfone, aminobenzamide, aminobenzenesulfonamide, aminophenylmaleimide, aminophenylphthalimide, aminobiphenyl, aminoterphenyl, aminonaphthalene, aminoanthracene, aminoanthraquinone, aminofluorene, aminopyrrolidine, aminopiperazine, aminopiperidine, aminohomopiperidine, aminomorpholine, aminobenzodioxole, aminobenzodioxane, aminopyridine, aminopyridazine, aminopyrimidine, aminopyrazine, aminoquinoline, aminocinnoline, aminophthalazine, aminoquinazoline, aminoquinoxaline, aminopyrrole, aminoimidazole, aminopyrazole, aminotriazole, aminooxazol, aminoisoxazole, aminothiazole, aminoisothiazole, aminoindole, aminobenzimidazole, aminoindazole, aminobenzoxazole, aminobenzothiazole, benzylamine, phenethylamine, phenylpropylamine, phenylbutylamine, benzhydrylamine, aminoethyl-1,3-dioxolane, aminoethylpyrrolidine, aminoethylpiperazine, aminoethylpiperidine, aminoethylmorpholine, aminopropylimidazole, aminopropylcyclohexane, aminophenol, and 2-(4-aminophenyl)-2-(4-hydroxyphenyl) propane.

The mixing ratios of these dicarboxylic anhydride and monoamine compound may be optionally selected taking the end-use and viscosity into consideration. For example, these dicarboxylic anhydride and monoamine compound may be added preferably at a ratio of 0.02 to 0.4 molar equivalent based on tetracarboxylic dianhydride and diamine compounds, respectively.

As for the method of synthesizing the polyamic acid represented by the aforementioned general formula (1), there is not any particular restriction. However, it may be preferable to carry out the polymerization thereof in an organic polar solvent which is free from water and in an inert gas atmosphere.

Examples of such an organic polar solvent which may be employed in this polymerization reaction are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoramide, N-methyl-ε-caprolactam, N-acetyl-ε-caprolactam, 1,2-dimethoxyethane, 1,2-diethoxyethane, bis(2-methoxyethyl) ether, bis(2-ethoxyethyl) ether, 1,2-bis(2-methoxyethoxy) ethane, bis[2-(2-methoxyethoxy)ethyl] ether, 1-acetoxy-2-methoxyethane, 1-acetoxy-2-ethoxyethane, (2-acetoxyethyl)(2-methoxyethyl) ether, (2-acetoxyethyl) (2-ethoxyethyl) ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, γ-butyrolactone, propylene carbonate, phenol, cresol, acetone, methylethyl ketone, methylisobutyl ketone; cyclohexanone and acetonylacetone. These organic solvents may be employed singly or in combination of two or more kinds.

The temperature of this polymerization reaction may be generally in the range of −20 to 100° C. preferably in the range of −5 to 30° C. There is any particular limitation with respect to the reaction pressure, and hence the reaction can be performed satisfactorily under the normal pressure. The reaction time depends on the kinds of tetracarboxylic dianhydride and also on the kinds of the solvent to be employed in the reaction. Generally, a time period of 0.5 to 24 hours may be sufficient for the reaction. The polyamic acid constituting a component of the photosensitive polymer composition according to this invention can be easily synthesized without accompanying any troublesome process and without being contaminated with impurities during the manufacturing process.

With regard to the inherent viscosity (logarithmic viscosity number) of the polyamic acid to be obtained in this case, it is preferable to control such that the inherent viscosity of 0.5 wt % solution of the polyamic acid in N-methyl-2-pyrrolidinone at a temperature of 30° C. is 0.3 (dl/g) or more, more preferably in the range of 0.3 (dl/g) to 3.0 (dl/g). The reason for this is that if the inherent viscosity of the polyamic acid is too low, i.e. if the polymerization degree of the polyamic acid is too low, it is difficult to obtain a polyimide resin having a sufficient heat resistance, whereas if the inherent viscosity of the polyamic acid is too high, i.e. if the polymerization degree of the polyamic acid is too high, the handling of it would become difficult.

Followings are detailed explanations on a photosensitive heat cure accelerator which can be inactivated of its thermal cure-accelerating property by irradiation of light and constitutes a component to be contained in a positive photosensitive polymer composition of this invention.

A first type of the photosensitive heat cure accelerator according to this invention is an azomethine compound represented by the following general formula (2).

wherein $Ar^{11}$ is a substituted or unsubstituted nitrogen-containing aromatic heterocyclic group having pyridine type nuclear nitrogen atom (—N=) and a bonding hand extending from a nuclear carbon atom located next to the nuclear nitrongen atom, examples of which being shown below:

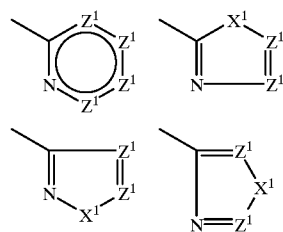

wherein $—Z^1=$ is $=C(R^{14})—$ or $=N—$ (adjacent $Z^1$s may be formed into a fused ring); and $—X^1—$ is $—O—$, $—S—$, $—Se—$, $—Te—$ or $—N(R^{15})N—$; wherein $R^{14}$ and $R^{15}$ represent individually a substituted or unsubstituted aromatic hydrocarbon group, heterocyclic group, aliphatic hydrocarbon group, alicyclic hydrocarbon group, characteristic group or hydrogen atom.

Examples of the unsubstituted nitrogen-containing aromatic heterocyclic group to be introduced as the $Ar^{11}$ are 2-pyridyl, 2-quinolyl, 1-isoquinolyl, 3-isoquinolyl, 6-phenanthridinyl, 1,10-phenanthrolin-2-yl, 3-pyridazinyl, 1-phthalazinyl, 3-cinnolinyl, 2-pyrimidinyl, 4-pyrimidinyl, 2-quinazolinyl, 4-quinazolinyl, 2-pyrazinyl, 2-quinoxalinyl, 1,3,5-triazin-2-yl, 1,2,4,5-tetrazin-3-yl, 2-imidazolyl, 4-imidazolyl, 2-benzimidazolyl, 2-naphthimidazolyl, 3-pyrazolyl, 3-indazolyl, 2-oxazolyl, 4-oxazolyl, 2-benzoxazolyl, 2-naphthoxazolyl, 3-isoxazolyl, 3-benzisoxazolyl, 2-thiazolyl, 4-thiazolyl, 2-benzothiazolyl, 2-naphthothiazolyl, 2-selenazolyl, 2-benzoselenazolyl, 2-tellurazolyl, 2-benzotellurazolyl, 1,2,3-triazol-4-yl, 1,2,4-triazol-3-yl, 1,2,4-triazol-5-yl and 1,2,3,5-tetrazol-5-yl.

Examples of a substituent group to be introduced into the nitrogen-containing aromatic heterocyclic group so as to form a substituted nitrogen-containing aromatic heterocyclic compound are di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anisidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pirazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; hydroxy group; oxime group (hydroxyiminomethyl, methoxyiminomethyl, ethoxyiminomethyl, hydroxyiminoethyl and hydroxyiminopropyl group); alkoxyalkyl group (hydroxymethyl, hydroxyethyl and hydroxypropyl group); cyano group; cyanato group; thiocyanato group; nitro group; nitroso group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl. fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; and organosilicic group (silyl, disilanyl, trimethylsilyl and triphenylsilyl group).

Preferable examples of the nitrogen-containing aromatic heterocyclic group to be introduced as the $Ar^{11}$ into the compound represented by the aforementioned general formula (2) are ones wherein the acid dissociation constant "pKa" of chemical species protonated to the pyridine type nuclear nitrogen atom (—N═) is in the range of pH 1 to 10. Specific examples of such a nitrogen-containing aromatic heterocyclic group are 2-pyridyl, 2-quinolyl, 1-isoquinolyl, 3-isoquinolyl, 6-phenanthridinyl, 3-pyridazinyl, 1-phthalazinyl, 3-cinnolinyl, 2-pyrimidinyl, 4-pyrimidinyl, 2-quinazolinyl, 4-quinazolinyl, 2-imidazolyl, 4-imidazolyl, 2-benzimidazolyl, 3-pyrazolyl, 3-indazolyl, 2-thiazolyl, 4-thiazolyl and 2-benzothiazolyl. More preferable examples of the nitrogen-containing aromatic heterocyclic groups are those groups and those which are substituted by various kinds of the aforementioned characteristic group.

The $R^{11}$ in the general formula (2) is a substituted or unsubstituted aromatic hydrocarbon group, heterocyclic group, aliphatic hydrocarbon group, alicyclic hydrocarbon group, acyl group or hydrogen atom.

Examples of the unsubstituted aromatic hydrocarbon group to be introduced as $R^{11}$ are benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring. These aromatic hydrocarbon groups may be substituted by various kinds of the aforementioned characteristic group.

Specific examples of the unsubstituted heterocyclic group to be introduced as $R^{11}$ are pyrrole ring, pyrroline ring, pyrrolidine ring, indole ring, isoindole ring, indoline ring, isoindoline ring, indolizine ring, carbazole ring, carboline ring, furan ring, oxolane ring, coumarone ring, coumaran ring, isobenzofuran ring, phthalan ring, dibenzofuran ring, thiophene ring, thiolane ring, benzothiophene ring, dibenzothiophene ring, pyrazole ring, pyrazoline ring, indazole ring, imidazole ring, imidazoline ring, imidazolidine ring, benzimidazole ring, benzimidazoline ring, naphthimidazole ring, oxazole ring, oxazoline ring, oxazolidine ring, benzoxazole ring, benzoxazoline ring, naphthoxazole ring, isoxazole ring, benzisoxazole ring, thiazole ring, thiazoline ring, thiazolidine ring, benzothiazole ring, benzothiazoline ring, naphthothiazole ring, isothiazole ring, benzisothiazole ring, triazole ring, benzotriazole ring, oxadiazole ring, thiadiazole ring, benzoxadiazole ring, benzothiadiazole ring, tetrazole ring, purine ring, pyridine ring, piperidine ring, quinoline ring, isoquinoline ring, acridine ring, phenanthridine ring, benzoquinoline ring, naphthoquinoline ring, naphthylidine ring, phenanthroline ring, pyridazine ring, pyrimidine ring, pyrazine ring, piperazine ring, phthalazine ring, quinoxaline ring, quinazoline ring, cinnoline ring, phenazine ring, perimidine ring, triazine ring, tetrazine ring, pteridine ring, oxazine ring, benzoxazine ring, phenoxazine ring, thiazine ring, benzothiazine ring, phenothiazine ring, oxadiazine ring, thiadiazine ring, dioxolane ring, benzodioxole ring, dioxane ring, benzodioxane ring, dithiolane ring, benzodithiol ring, dithiane ring, benzodithiane ring, pyrane ring, chromene ring, xanthene ring, oxane ring, coumarone ring, isocoumarone ring, trioxane ring, thiane ring, trithiane ring, morpholine ring, quinuclidine ring, selenazole ring, benzoselenazole ring, naphthoselenazole ring, tellurazole ring and benzotellurazole ring. These heterocyclic groups may be substituted by various kinds of the aforementioned characteristic group.

Specific examples of the unsubstituted aliphatic hydrocarbon group to be introduced as $R^{11}$ are methyl, ethyl, propyl, isopropyl, butyl, isobutyl, sec-butyl, tert-butyl, pentyl, tert-pentyl, isopentyl, neopentyl, hexyl, isohexyl, heptyl, octyl, nonyl, decyl, vinyl, allyl, isopropenyl, propenyl, methalyl, crotyl, butenyl, pentenyl, butadienyl, ethynyl, propynyl, butynyl and pentynyl. These aliphatic hydrocarbon groups may be substituted by various kinds of the aforementioned characteristic group.

Specific examples of the unsubstituted alicyclic hydrocarbon group to be introduced as $R^{11}$ are cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl and cyclohexadienyl. These alicyclic hydrocarbon groups may be substituted by various kinds of the aforementioned characteristic group.

The $R^{12}$ in the general formula (2) is —OH, —NH—$R^{13}$ or —COOH, wherein $R^{13}$ is a substituted or unsubstituted aromatic hydrocarbon group, heterocyclic group, aliphatic hydrocarbon group, alicyclic hydrocarbon group, acyl group, thioacyl group or carbamoyl group.

Even though the aforementioned azomethine compound has a cure accelerating property (cyclodehydration reaction-accelerating property) before it is irradiated with light, it can be inactivated of its cure accelerating property (cyclodehydration reaction-accelerating property) when it is irradiated with light. Specifically, when this compound is irradiated with light, a geometrical isomerization reaction is caused in the compound thereby forming an intramolecular hydrogen bonding therein. When this intramolecular hydrogen bonding is formed in this manner, the cure accelerating property of the compound is inactivated.

When any of the aforementioned photosensitive heat cure accelerating agents are added to a solution of a thermosetting polymer precursor such as polyimide precursor (polyamic acid) which can be thermally cured through a cyclodehydration thereof, it is possible to obtain a positive photosensitive polymer composition which is capable of forming a fine pattern when it is subjected to a patterning process comprising a step of coating the solution, a step of exposure, a step of PEB (baking after light exposure) and a step of development.

These photosensitive heat cure accelerating agents may be employed singly or in combination of two or more kinds at a mixing ratio falling within the range of not less than 0.1 molar equivalent, more preferably in the range of 0.1 to 4.0 molar equivalent, most preferably in the range of 0.1 to 2.0 molar equivalent per mole of repeating unit of the photosensitive polymer resin. The reason for limiting the range of mixing ratio of the photosensitive heat cure accelerator is as follows. Namely, if the mixing ratio of this heat cure accelerator is less than the lower limit, the photosensitivity of a layer of the resultant resin may become insufficient, thereby failing to obtain a sufficient resolution, whereas if the mixing ratio of this heat cure accelerator exceeds over the upper limit, a prominent thinning of the film may be resulted so that it would be difficult to form a clear thin film.

Next, a second type of the photosensitive heat cure accelerator which will be incorporated in a positive photosensitive polymer composition according to this invention will be explained in detail as follows.

A second type of the photosensitive heat cure accelerator according to this invention is a nitrogen-containing heterocyclic compound represented by the following general formula (3).

(3)

wherein $Ar^{21}$ is a substituted or unsubstituted nitrogen-containing aromatic heterocyclic group having pyridine type nuclear nitrogen atom (—N=), examples of which being shown below:

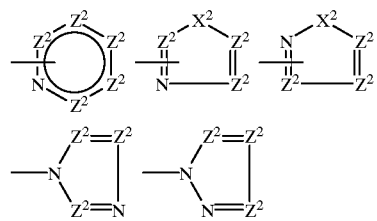

wherein =$Z^2$— is —$C(R^{21})$— or =N— (a couple of neighboring $Z^2$s may be formed into a fused ring) (wherein $R^{21}$ represents a substituted or unsubstituted aromatic hydrocarbon group, heterocyclic group, aliphatic hydrocarbon group, alicyclic hydrocarbon group, characteristic group or hydrogen atom); and —$X^2$— is —O—, —S, —Se— or —Te—.

Examples of the unsubstituted nitrogen-containing aromatic heterocyclic group to be introduced as $Ar^{21}$ are pyridyl, quinolyl, isoquinolyl, phenanthridinyl, phenanthrolinyl, pyridazinyl, phthalazinyl, cinnolinyl, pyrimidinyl, quinazolinyl, pyrazinyl, quinoxalinyl, 1,3,5-triazinyl, 1,2,4,5-tetrazinyl, imidazolyl, benzimidazolyl, naphthimidazolyl, pyrazolyl, indazolyl, oxazolyl, benzoxazolyl, naphthoxazolyl, isoxazolyl, benzisoxazolyl, thiazolyl, benzothiazolyl, naphthothiazolyl, selenazolyl, benzoselenazolyl, tellurazolyl, benzotellurazolyl, 1,2,3-triazolyl, 1,2,4-triazolyl, 1,2,3,5-tetrazolyl, and naphthidinyl.

Examples of a substituent group to be introduced into the nitrogen-containing aromatic heterocyclic group so as to form a substituted nitrogen-containing aromatic heterocyclic compound are di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anisidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pirazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; hydroxy group; oxime group (hydroxyiminomethyl, methoxyiminomethyl, ethoxyiminomethyl and hydroxyiminoethyl, hydroxyiminopropyl group); alkoxyalkyl group (hydroxymethyl, hydroxyethyl and hydroxypropyl group); cyano group; cyanato group; thiocyanato group; nitro group; nitroso group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; organosilicic group (silyl, disilanyl, trimethylsilyl and triphenylsilyl group).

Preferable examples of the nitrogen-containing aromatic heterocyclic group to be introduced as $Ar^{21}$ into the compound represented by the aforementioned general formula (3) are ones wherein the acid dissociation constant "pKa" of chemical species protonated to the pyridine type nuclear nitrogen atom (—N═) falls within the range of pH 1 to 10. Specific examples of such a nitrogen-containing aromatic heterocyclic group are pyridyl, quinolyl, isoquinolyl, phenanthridinyl, pyridazinyl, phthalazinyl, cinnolinyl, pyrimidinyl, quinazolinyl, imidazolyl, benzimidazolyl, pyrazolyl, indazolyl, thiazolyl, benzothiazolyl and naphthyridinyl. More preferable examples of the nitrogen-containing aromatic heterocyclic groups are those groups and those which are substituted by various kinds of the aforementioned characteristic group.

The $R^{20}$ in the aforementioned general formula (3) may be selected from the following groups (a-1) to (a-8).

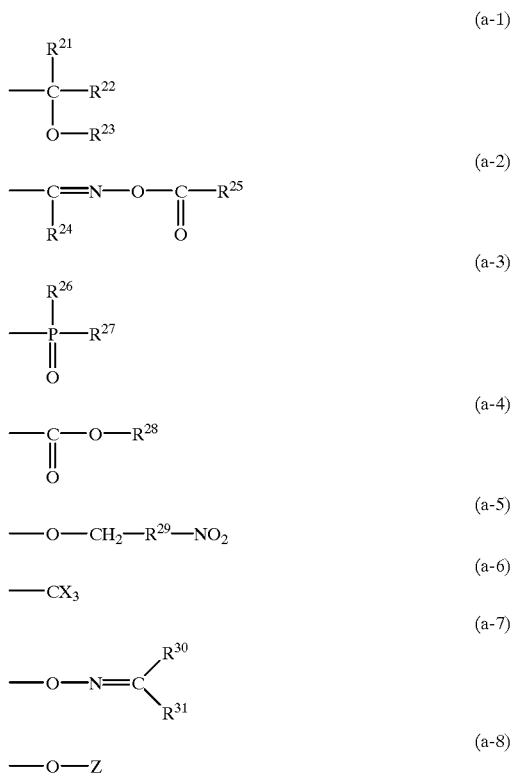

wherein $R^{21}$ and $R^{22}$ represent individually a substituted or unsubstituted aromatic hydrocarbon group, heterocyclic group, aliphatic hydrocarbon group, alicyclic hydrocarbon group, alkoxy group, hydroxy group or hydrogen atom ($R^{21}$ and $R^{22}$ may be bonded together to form an alicyclic hydrocarbon group); $R^{23}$, $R^{24}$, $R^{25}$, $R^{30}$ and $R^{31}$ represent individually a substituted or unsubstituted aromatic hydrocarbon group, heterocyclic group, aliphatic hydrocarbon group, alicyclic hydrocarbon group or hydrogen atom; $R^{26}$, $R^{27}$ and $R^{28}$ represent individually a substituted or unsubstituted aromatic hydrocarbon group, heterocyclic group, aliphatic hydrocarbon group or alicyclic hydrocarbon; $R^{29}$ represents a substituted or unsubstituted aromatic hydrocarbon group or aromatic heterocyclic group; X is a halogen; and Z is a cycloamino group.

Examples of the unsubstituted aromatic hydrocarbon group to be introduced as $R^{21}$ to $R^{31}$ are benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring. These aromatic hydrocarbon groups may be substituted by various kinds of the aforementioned characteristic group.

Specific examples of the unsubstituted heterocyclic group to be introduced as $R^{21}$ to $R^{31}$ are pyrrole ring, pyrroline ring, pyrrolidine ring, indole ring, isoindole ring, indoline ring, isoindoline ring, indolizine ring, carbazole ring, carboline ring, furan ring, oxolane ring, coumarone ring, coumaran ring, isobenzofuran ring, phthalan ring, dibenzofuran ring, thiophene ring, thiolane ring, benzothiophene ring, dibenzothiophene ring, pyrazole ring, pyrazoline ring, indazole ring, imidazole ring, imidazoline ring, imidazolidine ring, benzimidazole ring, benzimidazoline ring, naphthimidazole ring, oxazole ring, oxazoline ring, oxazolidine ring, benzoxazole ring, benzoxazoline ring, naphthoxazole ring, isoxazole ring, benzisoxazole ring, thiazole ring, thiazoline ring, thiazolidine ring, benzothiazole ring, benzothiazoline ring, naphthothiazole ring, isothiazole ring, benzisothiazole ring, triazole ring, benzotriazole ring, oxadiazole ring, thiadiazole ring, benzoxadiazole ring, benzothiadiazole ring, tetrazole ring, purine ring, pyridine ring, piperidine ring, quinoline ring, isoquinoline ring, acridine ring, phenanthridine ring, benzoquinoline ring, naphthoquinoline ring, naphthylidine ring, phenanthroline ring, pyridazine ring, pyrimidine ring, pyrazine ring, piperazine ring, phthalazine ring, quinoxaline ring, quinazoline ring, cinnoline ring, phenazine ring, perimidine ring, triazine ring, tetrazine ring, pteridine ring, oxazine ring, benzoxazine ring, phenoxazine ring, thiazine ring, benzothiazine ring, phenothiazine ring, oxadiazine ring, thiadiazine ring, dioxolane ring, benzodioxole ring, dioxane ring, benzodioxane ring, dithiolane ring, benzodithiol ring, dithiane ring, benzodithiane ring, pyrane ring, chromene ring, xanthene ring, oxane ring, coumarone ring, isocoumarone ring, trioxane ring, thiane ring, trithiane ring, morpholine ring, quinuclidine ring, selenazole ring, benzoselenazole ring, naphthoselenazole ring, tellurazole ring and benzotellurazole ring. These heterocyclic groups may be substituted by various kinds of the aforementioned characteristic group.

Specific examples of the unsubstituted aliphatic hydrocarbon group to be introduced as $R^{21}$ to $R^{28}$, $R^{30}$ and $R^{31}$ are methyl, ethyl, propyl, isopropyl, butyl, isobutyl, sec-butyl, tert-butyl, pentyl, tert-pentyl, isopentyl, neopentyl, hexyl, isohexyl, heptyl, octyl, nonyl, decyl, vinyl, allyl, isopropenyl, propenyl, methalyl, crotyl, butenyl, pentenyl, butadienyl, ethynyl, propynyl, butynyl and pentynyl. These aliphatic hydrocarbon groups may be substituted by various kinds of the aforementioned characteristic group.

Specific examples of the unsubstituted alicyclic hydrocarbon group to be introduced as $R^{21}$ to $R^{28}$, $R^{30}$ and $R^{31}$ are cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl and cyclohexadienyl. These alicyclic hydrocarbon groups may be substituted by various kinds of the aforementioned characteristic group.

Specific examples of the unsubstituted aromatic heterocyclic group to be introduced as $R^{29}$ are pyrrole ring, indole ring, isoindole ring, carbazole ring, furan ring, coumarone ring, isobenzofuran ring, thiophene ring, benzothiophene ring, dibenzothiophene ring, pyrazole ring, indazole ring, imidazole ring, benzimidazole ring, naphthimidazole ring, oxazole ring, benzoxazole ring, naphthoxazole ring, isoxazole ring, benzisoxazole ring, thiazole ring, benzothiazole ring, naphthothiazole ring, isothiazole ring, benzisothiazole ring, triazole ring, benzotriazole ring, oxadiazole ring, thiadiazole ring, benzoxadiazole ring, benzothiadiazole ring, tetrazole ring, purine ring, pyridine ring, quinoline ring, isoquinoline ring, acridine ring, phenanthridine ring, benzoquinoline ring, naphthoquinoline ring, naphthylidine ring, phenanthroline ring, pyridazine ring, pyrimidine ring, pyrazine ring, piperazine ring, phthalazine ring, quinoxaline ring, quinazoline ring, cinnoline ring, phenazine ring, perimidine ring, triazine ring, tetrazine ring, pteridine ring, oxazine ring, benzoxazine ring, phenoxazine ring, thiazine ring, benzothiazine ring, phenothiazine ring, oxadiazine ring, thiadiazine ring, benzodioxole ring, benzodioxane ring, pyrane ring, chromene ring, xanthene ring, coumarone ring, isocoumarone ring, selenazole ring, benzoselenazole ring, naphthoselenazole ring, tellurazole ring and benzotellurazole ring. These heterocyclic groups may be substituted by various kinds of the aforementioned characteristic group.

Specific examples of the halogen to be introduced as X are fluorine, chlorine, bromine and iodine atom.

Specific examples of the substituted amino group to be introduced as Z are pyrrol-1-yl, pyrrolin-1-yl, pyrrolidin-1-yl, indol-1-yl, isoindol-2-yl, indolin-1-yl, isoindolin-2-yl, carbazol-9-yl, pyrazol-1-yl, pyrazolin-1-yl, pyrazolidin-1-yl, imidazol-1-yl, imidazolin-1-yl, imidazolidin-1-yl, piperazin-1-yl, piperidin-1-yl, morpholin-4-yl, 2-pyrrolidin-1-yl, 2-piperidin-1-yl, piperazine-2,5-dion-1-yl, pyrrolidine-2,5-dion-1-yl, pyrrole-2,5-dion-1-yl, isoindole-1,3-dion-2-yl, benzo[f]isoindole-1,3-dion-2-yl, piperidine-2,5-dion-1-yl and benzo[de]isoquinoline-1,3-dion-2-yl.

The nitrogen-containing hetrocyclic compounds where $R^{20}$ is represented by any of the groups (a-1), (a-2), (a-5), (a-7) and (a-8) in the general formula (3) are especially preferable since it can be easily synthesized without leaving a minimal amount of residues and is capable of giving a photosensitive polymer resin composition having a high sensitivity. For instance, the nitrogen-containing hetrocyclic compounds where $R^{20}$ is represented by (a-5) in the general formula (3) can be synthesized through a reaction between heteroarylcarboxylic acid chloride and nitroaryl methanol.

Even though the aforementioned nitrogen-containing heterocyclic compound has a cure accelerating property (cyclodehydration reaction-accelerating property) before it is irradiated with light, it can be inactivated of its cure accelerating property (cyclodehydration reaction-accelerating property) when it is irradiated with light. Specifically, when this compound is irradiated with light, a photodissociation reaction is caused in the compound thereby forming a nitrogen-containing heterocyclic compound having a carboxyl group on its side chain. When this compound having a carboxyl group on its side chain is formed in this manner, the cure accelerating property of the compound will be inactivated.

When any of the aforementioned photosensitive heat cure accelerating agents are added to a solution of a thermosetting polymer precursor such as polyimide precursor (polyamic acid) which can be thermally cured through a cyclodehydration thereof, it is possible to obtain a positive photosensitive polymer composition which is capable of forming a fine pattern when it is subjected to a patterning process comprising a step of coating the solution, a step of exposure, a step of PEB (baking after light exposure) and a step of development.

These photosensitive heat cure accelerating agents may be employed singly or in combination of two or more kinds at a mixing ratio falling within the range of not less than 0.1 molar equivalent, more preferably in the range of 0.1 to 4.0 molar equivalent, most preferably in the range of 0.1 to 2.0 molar equivalent per mole of repeating unit of the photosensitive polymer resin. The reason for limiting the range of mixing ratio of the photosensitive heat cure accelerator is as follows. Namely, if the mixing ratio of this heat cure accelerator is less than the lower limit, the photosensitivity of a layer of the resultant resin may become insufficient, thereby failing to obtain a sufficient resolution, whereas if the mixing ratio of this heat cure accelerator exceeds over the upper limit, a prominent thinning of the film may be resulted so that it would be difficult to form a clear thin film.

A third type of the photosensitive heat cure accelerator according to this invention is a substituted or unsubstituted fused cyclic or unfused cyclic pyridinequinone diazide compound or quinolinequinone diazide compound.

Examples of unsubstituted cyclic pyridinequinone diazide compound useful in this case are pyridine-3,4-quinone-3-diazide. On the other hand, examples of unsubstituted cyclic quinolinequinone diazide compound are quinoline-3,4-quinone-3-diazide, quinoline-3,4-quinone-4-diazide, quinoline-5,6-quinone-5-diazide, quinoline-5,6-quinone-6-diazide, quinoline-7,8-quinone-8-diazide, quinoline-7,8-quinone-7-diazide, benzo[f]quinoline-3,4-quinone-3-diazide, benzo[g]quinoline-3,4-quinone-3-diazide, and benzo[h]quinoline-3,4-quinone-3-diazide.

Examples of a substituent group to be introduced into the pyridinequinone diazide compound or quinolinequinone diazide compound so as to form a substituted pyridinequinone diazide compound or a substituted quinolinequinone diazide compound are di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anisidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pirazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl and hydroxyiminopropyl group); hydroxy group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); alkoxyalkyl group (hydroxymethyl, hydroxyethyl and hydroxypropyl group); cyano group; cyanato group; thiocyanato group; nitro group; nitroso group; mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; and organosilicic group (silyl, disilanyl, trimethylsilyl and triphenylsilyl group).

Even though these aforementioned pyridinequinone diazide compound and quinolinequinone diazide compound have a cure accelerating property (cyclodehydration reaction-accelerating property) before they are irradiated with light, they can be inactivated of their cure accelerating property (cyclodehydration reaction-accelerating property) when they are irradiated with light. Specifically, when these compounds are irradiated with light, a denitrification reaction is caused in the compounds thereby forming a ketene compound, which is then reacted with ambient water to form a pyrrole carboxylic acid compound or a cyclopentapyridine carboxylic acid compound, thereby losing the cure accelerating property (cyclodehydration reaction-accelerating property) thereof. For example, quinoline-3,4-quinone-3-diazide exhibits an excellent cure accelerating property before it is irradiated with light. However, when it is irradiated with light, it is turned into a ketene compound, which is then reacted with ambient water to form indole-3-carboxylic acid, thereby losing its heat cure accelerating property.

When any of the aforementioned photosensitive heat cure accelerating agents are added to a solution of a thermosetting polymer precursor such as polyimide precursor (polyamic acid) which can be thermally cured through a cyclodehydration thereof, it is possible to obtain a positive photosensitive polymer composition which is capable of forming a fine pattern when it is subjected to a patterning process comprising a step of coating the solution, a step of exposure, a step of PEB (baking after light exposure) and a step of development.

These photosensitive heat cure accelerating agents may be employed singly or in combination of two or more kinds at a mixing ratio falling within the range of not less than 0.1 molar equivalent, more preferably in the range of 0.1 to 4.0 molar equivalent, most preferably in the range of 0.1 to 2.0 molar equivalent per mole of repeating unit of the photosensitive polymer resin. The reason for limiting the range of mixing ratio of the photosensitive heat cure accelerator is as follows. Namely, if the mixing ratio of this heat cure accelerator is less than the lower limit, the photosensitivity of a layer of the resultant resin may become insufficient, thereby failing to obtain a sufficient resolution, whereas if the mixing ratio of this heat cure accelerator exceeds over the upper limit, a prominent thinning of the film may be resulted so that it would be difficult to form a clear thin film.

A fourth type of the photosensitive heat cure accelerator according to this invention is a nitrogen-containing heterocyclic compound where the hydroxy group of a substituted or unsubstituted fused cyclic or unfused cyclic 2-hydroxypyridine compound is substituted by a protective substituent group which can be eliminated by the irradiation of light.

Examples of unsubstituted fused cyclic or unfused cyclic 2-hydroxypyridine compound useful in this case are 2-hydroxypyridine, 2-hydroxyquinoline, 1-hydroxyisoquinoline, 3-hydroxyisoquinoline, 6-hydroxyphenanthridine, 2-hydroxybenzo[f]quinoline, 2-hydroxybenzo[g]quinoline, 2-hydroxybenzo[h]quinoline, 1-hydroxybenzo[f]isoquinoline, 1-hydroxybenzo[g]isoquinoline, 1-hydroxybenzo[h]isoquinoline, 3-hydroxybenzo[f]isoquinoline, 3-hydroxybenzo[g]isoquinoline, and 3-hydroxybenzo[h]isoquinoline. At least one of these nitrogen-containing heterocyclic compounds can be employed in the resin composition.

Examples of a substituent group to be introduced into the nitrogen-containing heterocyclic group so as to form a substituted nitrogen-containing heterocyclic compound are di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anisidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pirazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; hydroxy group; oxime group (hydroxyiminomethyl, methoxyiminomethyl, ethoxyiminomethyl, hydroxyiminoethyl and hydroxyiminopropyl group); alkoxyalkyl group (hydroxymethyl, hydroxyethyl and hydroxypropyl group); cyano group; cyanato group; thiocyanato group; nitro group; nitroso group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; organosilicic group (silyl, disilanyl, trimethylsilyl and triphenylsilyl group).

Examples of the protective substituent group which is capable of protecting hydroxy group of the aforementioned substituted or unsubstituted nitrogen-containing heterocyclic compound and can be eliminated by the irradiation of light are nitro substituted benzyl group (2-nitrobenzyl, 4-nitrobenzyl and 2,4-dinitrobenzyl group); acyl group (formyl, acetyl, benzoyl, nitrobenzoyl, pyridinecarbonyl and trifluoroacetyl group); acylmethyl group (acetonyl, phenacyl, nitrophenacyl and pyridinecarbonylmethyl); substituted or unsubstituted alkoxycarbonyl group (benzyloxycarbonyl, 2-phenylisopropoxycarbonyl, 2-nitrobenzyloxycarbonyl, 4-nitrobenzyloxycarbonyl, 2,4-dinitrobenzyloxycarbonyl, 2-cyanomethylisopropoxycarbonyl, and 2-methylsulfonylisopropoxycarbonyl group); sulfonyl group (mesyl, phenylsulfonyl, tosyl, pyridylsulfonyl, trifluoromethylsulfonyl, diazophenolsulfonyl and diazonaphtholsulfonyl group); and sulfonylmethyl group (phenylsulfonylmethyl, tosylmethyl, pyridylsulfonylmethyl and trifluoromethylsulfonylmethyl group).

Even though the 2-hydroxypyridine compound whose hydroxy group is substituted by a protective substituent group eliminable by the irradiation of light have a cure accelerating property (cyclodehydration reaction-accelerating property) before it is irradiated with light, it can be inactivated of its cure accelerating property (cyclodehydration reaction-accelerating property) when it is irradiated with light. Specifically, when this compound is irradiated with light, the protective substituent group is eliminated, thereby generating a hydroxy group on a nuclear carbon atom neighboring to a nuclear nitrogen atom. As a result, the compound is turned into a cyclic amide through tautomerism, thereby losing the cure accelerating property thereof.

When any of the aforementioned photosensitive heat cure accelerating agents are added to a solution of a thermosetting polymer precursor such as polyimide precursor (polyamic acid) which can be thermally cured through a cyclodehydration thereof, it is possible to obtain a positive photosensitive polymer composition which is capable of forming a fine pattern when it is subjected to a patterning process comprising a step of coating the solution, a step of exposure, a step of PEB (baking after light exposure) and a step of development.

These photosensitive heat cure accelerating agents may be employed singly or in combination of two or more kinds at a mixing ratio falling within the range of not less than 0.1 molar equivalent, more preferably in the range of 0.1 to 4.0 molar equivalent, most preferably in the range of 0.1 to 2.0 molar equivalent per mole of repeating unit of the photosensitive polymer resin. The reason for limiting the range of mixing ratio of the photosensitive heat cure accelerator is as follows. Namely, if the mixing ratio of this heat cure accelerator is less than the lower limit, the photosensitivity of a layer of the resultant resin may become insufficient, thereby failing to obtain a sufficient resolution, whereas if the mixing ratio of this heat cure accelerator exceeds over the upper limit, a prominent thinning of the film may be resulted so that it would be difficult to form a clear thin film.

If desired in view of enhancing the sensitivity of the photosensitive heat cure accelerator, a sensitizing agent may be added to the photosensitive polymer composition of this invention. Specific examples of such a sensitizing agent are acetophenone, benzophenone, benzoin, 2-methylbenzoin, benzoin isopropyl ether, anthrone, 1,9-benzoanthrone, anthracene, phenanthrenequinone, pyrene-1,6-quinone, 9-fluorenone, 1,2-benzoanthraquinone, anthoanthrone, 2-chlorobenzanthraquinone, 2-bromobenzanthraquinone, 2-chloro-1,8-phthaloylnaphthalene, Michler's ketone, 4,4'-bis(diethylamino)benzophenone, benzoin methyl ether, benzyl dimethyl ketal, 2-methyl-1-[4-(methylthio)phenyl]-2-morpholino-1-propanone, 1-hydroxycyclohexyl phenyl ketone, ethyl N,N-dimethylaminobenzoate, acrydine, cyanoacrydine, nitropyrene, 1,8-dinitropyrene, 5-nitroacenaphthene, 2-nitrofluorene, 2-tertiary-butyl-9,10-anthraquinone and N-phenylmaleimide.

These sensitizing agents may be employed singly or in combination of two or more kinds at a mixing ratio falling within the range of not less than 0.01 molar equivalent, more preferably not less than 0.1 molar equivalent, most preferably from 0.1 to 5 molar equivalent, each based on one molar equivalent of the repeating unit of the photosensitive polymer resin. If the mixing ratio of this sensitizing agent falls outside this range, the developing property and film-forming property of the polymer composition may be badly affected.

If desired, a dyestuff, a surfactant and an alkali-soluble resin may be added to the photosensitive polymer composition of this invention.

The photosensitive polymer composition of this invention can be easily prepared by adding a photosensitive heat cure accelerator which is capable of inactivating a heat cure-accelerating property as it is irradiated with light to a solution, in an organic solvent, of a thermosetting polymer precursor such as polyamic acid which can be thermally cured through a cyclodehydration reaction. If desired, this photosensitive polymer composition may be further diluted with a suitable solvent. Further, it may be also possible to mix the solution of this photosensitive polymer composition with a sensitizing agent, a dyestuff, a surfactant or an alkali-soluble resin. If desired, the addition of these additives to the photosensitive polymer composition may be carried out through a filtration so as to remove any fine impurities included therein. Namely, the photosensitive polymer composition according to this invention can be easily prepared without undergoing any troublesome step while avoiding any possibility that the photosensitive polymer composition would be contaminated by impurities.

Examples of organic solvent to be used in the preparation of the aforementioned photosensitive polymer composition are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphospholic triamide, N-methyl-$\epsilon$-caprolactam, N-acetyl-$\epsilon$-caprolactam, 1,2-dimethoxyethane, 1,2-diethoxyethane, bis(2-methoxyethyl) ether, bis(2-ethoxyethyl) ether, 1,2-bis(2-methoxyethoxy)ethane, bis[2-(2-methoxyethoxy)ethyl] ether, 1-acetoxy-2-methoxyethane, 1-acetoxy-2-ethoxyethane, (2-acetoxyethyl) (2-methoxyethyl) ether, (2-acetoxyethyl) (2-ethoxyethyl) ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, $\gamma$-butyrolactone, propylene carbonate, phenol, cresol, acetone, methyl ethyl ketone, methyl isobutyl ketone; cyclohexanone, acetonylacetone. These organic solvents may be employed singly or in combination of two or more kinds.

Followings are detailed explanations on the method of forming a pattern by making use of a positive photosensitive polymer composition according to this invention.

First of all, a positive photosensitive polymer composition prepared as explained above is coated by way of spin coating method for instance on the surface of a substrate, and then dried by heating it with a hot plate for instance at temperature of not more than 180° C., more preferably not more than 120° C. thereby to obtain a resin layer. Since the photosensitive polymer composition of this invention contains a photosensitive heat cure-accelerating agent which is capable of accelerating the curing of the polymer unless it is exposed to light, the resin layer may be entirely cured and the resolution of the pattern may be deteriorated if the heat drying step of the resin layer is performed at a temperature exceeding over the aforementioned upper limit.

Next, a photomask having a predetermined pattern is superimposed on the resin layer formed as described above, and then a visible light, infrared ray, ultraviolet ray or an energy beam such as EB or X-ray is irradiated to the surface of the resin layer through the photomask, thereby exposing the predetermined regions of the resin layer to light. The method of this light exposure may be carried out by means of a contact exposure system or by means of a projection exposure system.

As a result of this light exposure, the heat cure-accelerating property of the photosensitive heat cure accelerator is inactivated at the exposure portions of the resin layer, and hence the curing of exposure portions of the resin layer can be inhibited from being cured even if the heat-treatment is performed after the light exposure. The mechanism of inactivating the heat cure-accelerating property of the photosensitive heat cure accelerator in each of the photosensitive heat cure accelerators has been already explained hereinabove.

Next, in subsequent to this light exposure process, the resin layer is subjected to a heat-treatment at a temperature ranging from 50 to 200° C., preferably 80 to 160° C. by making use of a hot plate for instance. As a result of this heat treatment, a thermal curing via the cyclodehydration of polyamic acid is promoted at the non-exposure portions of the resin layer due to the action of the cure-accelerator, thereby forming a polyimide layer. By contrast, the curing of the polyamic acid is substantially suppressed at the exposure portions since the cure-accelerating property of the photosensitive heat cure-accelerator has been already lost or inactivated as mentioned above, thus bringing about a marked difference in solubility in a developing solution of the polymer layer between the exposure portions and non-exposure portions. By the way, if the resin layer is heated at a temperature less than predetermined temperature in this heat treatment, it is hardly possible to sufficiently utilize the cure-accelerating property of the photosensitive heat cure accelerator, so that the thermal curing of the polymer would hardly proceed at the non-exposure portions. On the other hand, if the resin layer is heated at a temperature higher than predetermined temperature in this heat treatment, the curing of the polymer would prominently proceed even at the exposure portions. Therefore, if the temperature of this heat treatment falls outside the aforementioned range, the resolution of the resultant pattern would be deteriorated, thus making it difficult to form a fine pattern. The time required in this heat treatment is, though dependent on the temperature of this heat treatment, generally in the range of 0.5 to 60 minutes, more preferably in the range of 0.5 to 30 minutes. If the time for this heat treatment is too short, the thermal curing at the non-exposure portions would not proceed sufficiently, whereas if the time for this heat treatment is too long, the thermal curing of the polymer would markedly proceed even at the exposure portions. Therefore, if the time for this heat treatment falls outside the aforementioned range, the resolution of the resultant pattern would be deteriorated, thus making it difficult to form a fine pattern.

After this heat treatment, the resin layer is subjected to a development process by means of a dipping method, a spray method or a puddle method, using a suitable developing solution. As for the developing solution to be utilized in this method, an organic solvent type developing solution or an aqueous alkaline solution type developing solution may be employed.

Specific examples of such an organic solvent type developing solution are aprotic polar organic solvents such as N,N-dimethylformamide, N,N-dimethylacetamide, N,N-diethylacetamide, N,N-dimethoxyacetamide, N-benzyl-2-pyrrolidinone, N-acetyl-2-pyrrolidinone, N-benzyl-2-pyrrolidinone, 1,3-dimethyl-2-imidazolidinone, hexamethylphospholic triamide, dimethylsulfoxide, N-methyl-$\epsilon$-caprolactam and N-acetyl-$\epsilon$-caprolactam. These solvents may be employed singly or as a mixed solution together with a poor solvent for the polymer, such as methanol, ethanol, isopropyl alcohol, benzene, toluene, xylene, methyl Cellosolve or water.

Specific examples of such an aqueous alkaline solution type developing solution are an aqueous organic alkaline solution, such as tetramethylammonium hydroxide, tetraethylammonium hydroxide, choline, propylamine, butylamine, monoethanolethylenediamine, trimethylenediamine, trimethylammoniumhydroxide, hydrazine and trimethylhydroxyethylammonium hydroxide; and an aqueous inorganic alkaline solution, such as sodium hydroxide, potassium hydroxide, lithium hydroxide, sodium carbonate, potassium carbonate, ammonium carbonate, hydrogen potassium carbonate, ammonium phosphate and ammonia.

These aqueous solutions may be mixed with an organic solvent such as methanol, ethanol, acetone, 2-propanol, ethylene glycol, ethyl Cellosolve, butyl Cellosolve, diethylene glycol, diethylene glycol monoethyl ether, N-methylpyrrolidinone, N,N-dimethylformamide, N,N-dimethylacetamide and dimethylsulfoxide.

Although the employment of an organic solvent in the developing process is advantageous in that the contamination with a metallic impurity can be minimized, it is preferable to employ an aqueous alkaline solution type developing solution in view of safety, sanitation and environment. Furthermore, if an aqueous alkaline solution type developing solution is employed, the swelling of a polymer film pattern can be avoided.

As a result of the developing process as explained above, the exposure portions of the resin layer can be dissolved and removed, thus obtaining a positive polyimide film pattern. In particular, since a photosensitive heat cure accelerator which can be inactivated of its cure-accelerating property by an irradiation of light is incorporated in the photosensitive polymer composition of this invention, the cyclodehydration reaction of polyamic acid takes place only at the non-exposure portions of the resin layer in the heat treatment after the light exposure, thereby turning the non-exposure portions into a polyimide layer. By contrast, the curing of the polyamic acid does not proceed at the exposure portions since the cure-accelerating property of the cure-accelerator has been already lost or inactivated as mentioned above, thus leaving the exposure portions remained in the state of a polyamic acid.

Namely, as a result of the heat treatment after the light irradiation, polyimide is formed at the light non-exposure portions of the resin layer, while polyamic acid is left unchanged at the exposed portions, thus giving rise to the generation of a remarkable difference in solubility to the developing solution between the non-exposure portions and the exposure portions of the resin layer. As a result, only the exposure portions of the resin layer is selectively dissolved and removed in the developing process, thereby making it possible to form a fine pattern with high resolution.

It is preferable in view of removing any residue of developing solution to perform a rinsing of the resin layer after the developing process by making use of water, alcohol or acetone. It is also preferable for the purpose of not only drying the developing solution or rinsing solution but also completing the curing of any remaining uncured portions to perform a heat treatment or a vacuum heat treatment at a temperature in the range of 120 to 400° C.

It is possible according to the method of this invention to form a patterned polyimide film without the employment of photoresist and to perform the development process with an aqueous alkaline solution, thus obviating any problems involving safety and environmental pollution.

The patterned polyimide film formed in this manner can be used as an insulating material for forming an interlayer insulating film between conductive or semiconductive layers or for forming a wiring insulation film, or as a protecting material such as a passivation film in the manufacture of various kinds of electronic parts, e.g. a semiconductor element such as an LSI, a high-density printed wiring board, a thin film magnetic head, magnetic bubble memory, a solar cell, a thermal head, etc. It is also possible to utilize the patterned polyimide film formed according to the method of this invention as an optical material for forming an optical waveguide of an optical device, or as an orienting film of liquid crystal device. Since the patterned polyimide film formed in this manner is excellent in adhesion or bonding to substrate in addition to its inherent properties of high heat resistance and low dielectric constant, it is possible to further improve the reliability of electronic parts.

The positive polymer pattern formed in this manner according to this invention is also applicable to a fine working technique using a photolithography. For example, a positive photosensitive polymer composition of this invention may be used for forming a pattern on a predetermined substrate, and then a dry etching or a wet etching is performed in the conventional manner using the aforementioned pattern as an etching mask thereby to carry out the fine working of the substrate. In this case, if a fine working of 3 µm or less (in line width) is desired, a dry etching method may be preferably employed.

In the case of wet etching method, an aqueous solution of hydrofluoric acid or an aqueous solution of ammonium fluoride may be employed for etching a silicon oxide film, an aqueous solution of phosphoric acid, an aqueous solution of acetic acid or aqueous solution of nitric acid may be employed for etching an aluminum film, and an aqueous solution of ammonium cerium nitrate may be employed for etching an chrominum-based film. In the case of dry etching method, $CF_4$, $C_2F_6$, $CCl_4$, $BCl_{13}$, $Cl_2$, HCl, $H_2$, etc. may be employed as a dry etching gas. These etching gases may be combined if required. The conditions for the etching, i.e. the concentration of a wet etching agent in a reaction chamber, the concentration of a dry etching gas in a reaction chamber, reaction temperature and reaction time are determined depending on the combination of the kind of material on which a pattern is formed and the kind of a photosensitive polymer composition. There is not any particular limitation regarding the method of etching. The pattern formed with a photosensitive polymer composition of this invention and remaining on a substrate after an etching may be removed by making use of a release agent (for example, an aqueous solution of hydrazine) or an oxygen gas plasma.

Since a positive pattern is formed through the insolubilization of polymer to developing solution without accompanying the crosslinking of polyamic acid in the method of forming a pattern according to this invention, the thinning of film through the volume shrinkage thereof can be avoided, thereby making it possible to assure the accuracy of pattern. Moreover, since there is not any particular restriction regarding the structure of polyamic acid, i.e. a polyimide precursor, it is possible to easily form a polyimide film pattern which is excellent in electric properties, in heat resistance and in adhesion. Therefore, the photosensitive polymer composition of this invention is useful not only for forming an insulating film for various kinds of electronic parts, but also for conducting fine working on a predetermined substrate.

Followings are detailed explanations on specific examples of this invention. However, these examples should not be construed as limiting the present invention.

Various kinds of polyamic acid were synthesized as follows by making use of raw materials which were mixed together at a predetermined mixing ratio (shown in molar equivalent) as shown in the following Table 1. First of all, 50 ml of N,N-dimethylacetamide was placed under an argon gas atmosphere into a separable flask cooled down to –5 to 5° C. by making use of a cooling medium. Then, a predetermined amount of tetracarboxylic dianhydride was added to the flask and dissolved with stirring to obtain a solution. Subsequently, a predetermined amount of diamine compound was dissolved in 50 ml of N,N-dimethylacetamide to obtain a solution, which was then slowly dripped into the first mentioned solution by means of a dropping funnel provided with a pressure balance tube and stirred for 4 hours. Then, the resultant solution was further stirred at room temperature to obtain five kinds of polyamic acid, i.e. PAA1 to PAA5.

Then, the inherent viscosity of a 0.5 wt % solution of each of these polyamic acids in N-methyl-2-pyrrolidinone was measured at a temperature of 30° C., the results being shown in Table 1.

The codes of tetracarboxylic dianhydride compounds, diamine compounds and the solvent shown in Table 1 represent following compounds.

(Tetracarboxylic dianhydride compound)
PMA: Pyromellitic dianhydride.
BNTA: 3,3',4,4'-benzophenonetetracarboxylic dianhydride.
6FTA: 1,1,1,3,3,3-hexafluoro-2,2-propylidene-4,4'-diphthalic dianhydride.
(Diamine compound)
ODA: Oxy-4,4'-dianiline.
SNDA: Sulfonyl-3,31-dianiline
TSDA: 1,3-bis(3-aminopropyl)-1,1,3,3-5 tetramethyldisiloxane.
(Solvent)
DMAC: N,N-dimethylacetamide.

TABLE 1

|  | PAA1 | PAA2 | PAA3 | PAA4 | PAA5 |
|---|---|---|---|---|---|
| PMA | 1.00 | — | — | 1.00 | — |
| BNTA | — | 1.00 | — | — | 1.00 |
| 6FTA | — | — | 1.00 | — | — |
| ODA | 0.95 | 0.95 | 0.95 | — | — |
| SNDA | — | — | — | 0.95 | 0.95 |
| TSDA | 0.05 | 0.05 | 0.05 | 0.05 | 0.05 |
| Solvent | DMAC | DMAC | DMAC | DMAC | DMAC |
| Concentration wt % | 10.82 | 12.48 | 11.75 | 10.24 | 12.55 |
| Inherent viscosity* [dL/g] | 0.92 | 0.98 | 0.88 | 0.82 | 0.86 |

*) 0.5 wt % NMP (N-methyl-2-pyrrolidinone) solution Measuring temperature: 30° C.

These polyamic acids thus obtained were employed for the preparation of positive photosensitive polymer compositions of this invention as explained below.

EXAMPLE I

In this example, the azomethine compounds represented by the aforementioned general formula (2) were employed as a photosensitive heat cure-accelerator to prepare positive photosensitive polymer compositions, and the characteristics of these polymer compositions were investigated. The codes for these azomethine compounds employed in this example as a photosensitive heat cure-accelerator represent the following compounds.

PYX: 2-pyridine aldoxime
QNX: 2-quinoline aldoxime
IMX: 4-imidazole aldoxime
BIX: 2-benzimidazole aldoxime
PPX: phenyl-2-pyridyl ketoxime
PPH: 2-pyridinecarbaldehyde=2-pyridylhydrazone
PAH: 2-pyridinecarbaldehyde=acetylhydrazone
PSC: 2-pyridinecarbaldehyde=semicarbazone As shown in the following Tables 2 to 5, each solution of the polyamic acid synthesized in the aforementioned process was mixed with a photosensitive heat cure accelerator at a predetermined mixing ratio, and stirred at room temperature to obtain a homogeneous solution. The mixed solution was then filtered with a membrane filter having a pore size of 0.5 µm, thereby to prepare the photosensitive polymer compositions of this invention (Examples I-1 to I-40).

The patterning of resin layer was performed by making use of the photosensitive polymer compositions prepared as mentioned above for the purpose of investigating the resolution of these polymer compositions, the results being shown in the following Tables 2 and 3. Furthermore, polyimide films were formed to evaluate the adhesivity and heat resistance of these polymer compositions, the results being shown in the following Tables 4 and 5.

The resolution, adhesivity and heat resistance of these polymer compositions were evaluated as explained below.
(Evaluation of resolution)

First of all, a solution of each photosensitive polymer composition was coated on the surface of a silicon wafer 4 inches in diameter by means of a spin-coating method, and then the coated layer was heated (pre-baking) for 10 minutes on a hot plate heated up to 90° C. thereby to form a resin layer having a film thickness of about 5 μm. Then, the resin layer was exposed through a quartz mask for resolution test to the irradiation of a predetermined exposure dose by making use of a light exposure apparatus (PLA-501FA, Canon Co.).

After this light exposure, the silicon wafer was heated for 5 minutes (PEB) on a hot plate heated up to a temperature of 140° C., thereby allowing the heat curing through cyclo-dehydration of polyamic acid at the non-exposure portions of the resin layer to proceed.

Subsequently, the silicon wafer was subjected to a developing process wherein the silicon wafer was dipped into an alkaline developing solution (a 1.19 wt % aqueous solution of tetramethylammonium hydroxide) for 120 seconds, whereby selectively dissolving and removing the exposure portions of the resin layer. Thereafter, the resin layer was rinsed with water for 20 seconds.

Finally, the silicon wafer bearing a pattern of the resin layer as a result of the aforementioned development was heated on a hot plate heated up to 250° C. for 30 minutes to obtain a positive polyimide film pattern. Thereafter, a section of patterned film was observed with an electron microscope (SEM) to evaluate the resolution of the patterned film.
(Evaluation of adhesivity)

First of all, a solution of each photosensitive polymer composition was coated on the surface of a silicon wafer 4 inches in diameter by means of a spin-coating method, and then the coated layer was heated (pre-baking) for 10 minutes on a hot plate heated up to 90° C. thereby to form a resin layer having a film thickness of about 5 μm. Then, the silicon wafer was heated on a hot plate heated up to 250° C. for 30 minutes to obtain a sample of polyimide film. Subsequently, the silicon wafer was further heated for 24 hours at a temperature of 120° C. in a saturated aqueous vapor of 2 atmospheric pressure, and then the evaluation of adhesivity of the resin layer was performed according to a cross-cut adhesion test.
(Evaluation of heat resistance)

First of all, a solution of each photosensitive polymer composition was coated on the surface of a silicon wafer 4 inches in diameter by means of a spin-coating method, and then the coated layer was heated (pre-baking) for 10 minutes on a hot plate heated up to 90° C. thereby to form a resin layer having a film thickness of about 5 μm. Then, the silicon wafer was heated on a hot plate heated up to 250° C. for 30 minutes to obtain a sample of polyimide film.

Thereafter, the resin layer was peeled with a knife and then the 3 wt %-reduction temperature (in a nitrogen gas stream) of the resin layer was measured by means of thermogravimetric analysis (TGA).

TABLE 2

| | Polyamic acid | Photosensitive cure-accelerator | amount*) | Film thickness (μm) | Exposure dose (mJ/cm$^2$) | Resolution (μm) |
|---|---|---|---|---|---|---|
| Example I-1 | PAA1 | PYX | 1.0 | 5.0 | 300 | 3.0 |
| Example I-2 | PAA1 | QNX | 1.0 | 5.0 | 200 | 3.0 |
| Example I-3 | PAA1 | IMX | 1.0 | 5.0 | 300 | 2.5 |
| Example I-4 | PAA1 | BIX | 1.0 | 5.0 | 200 | 2.5 |
| Example I-5 | PAA1 | PPX | 1.0 | 5.0 | 200 | 2.5 |
| Example I-6 | PAA1 | PPH | 1.0 | 5.0 | 200 | 3.0 |
| Example I-7 | PAA1 | PAH | 1.0 | 5.0 | 300 | 3.5 |
| Example I-8 | PAA1 | PSC | 1.0 | 5.0 | 200 | 2.5 |
| Example I-9 | PAA2 | IMX | 1.0 | 5.1 | 300 | 2.5 |
| Example I-10 | PAA2 | BIX | 1.0 | 5.1 | 200 | 2.5 |

*)Molar ratio to the repeating unit of polyamic acid.

TABLE 3

| | Polyamic acid | Photosensitive cure-accelerator | amount*) | Film thickness (μm) | Exposure dose (mJ/cm$^2$) | Resolution (μm) |
|---|---|---|---|---|---|---|
| Example I-11 | PAA2 | PPX | 1.0 | 5.1 | 200 | 2.5 |
| Example I-12 | PAA3 | BIX | 1.0 | 5.0 | 200 | 2.5 |
| Example I-13 | PAA3 | PPX | 1.0 | 5.0 | 200 | 2.5 |
| Example I-14 | PAA3 | PSC | 1.0 | 5.0 | 200 | 2.5 |
| Example I-15 | PAA4 | QNX | 1.0 | 5.0 | 200 | 3.0 |
| Example I-16 | PAA4 | IMX | 1.0 | 5.0 | 300 | 2.5 |
| Example I-17 | PAA4 | PPH | 1.0 | 5.0 | 200 | 3.0 |
| Example I-18 | PAA5 | PYX | 1.0 | 5.1 | 300 | 3.0 |
| Example I-19 | PAA5 | QNX | 1.0 | 5.1 | 200 | 3.0 |
| Example I-20 | PAA5 | PAH | 1.0 | 5.1 | 300 | 3.5 |

*)Molar ratio to the repeating unit of polyamic acid.

TABLE 4

| | Polyamic acid | Photosensitive cure-accelerator | amount*) | Film thickness (μm) | Cross-cut adhension test | 3 wt %-reduction temperature |
|---|---|---|---|---|---|---|
| Example I-21 | PAA1 | PYX | 1.0 | 5.0 | 0/100 | 505° C. |
| Example I-22 | PAA1 | QNX | 1.0 | 5.0 | 0/100 | 505° C. |
| Example I-23 | PAA1 | IMX | 1.0 | 5.0 | 0/100 | 505° C. |
| Example I-24 | PAA1 | BIX | 1.0 | 5.0 | 0/100 | 505° C. |
| Example I-25 | PAA1 | PPX | 1.0 | 5.0 | 0/100 | 505° C. |
| Example I-26 | PAA1 | PPH | 1.0 | 5.0 | 0/100 | 505° C. |
| Example I-27 | PAA1 | PAH | 1.0 | 5.0 | 0/100 | 505° C. |
| Example I-28 | PAA1 | PSC | 1.0 | 5.0 | 0/100 | 505° C. |
| Example I-29 | PAA2 | IMX | 1.0 | 5.1 | 0/100 | 485° C. |
| Example I-30 | PAA2 | BIX | 1.0 | 5.1 | 0/100 | 485° C. |

*)Molar ratio to the repeating unit of polyamic acid.

TABLE 5

| | Polyamic acid | Photosensitive cure-accelerator | amount*) | Film thickness (μm) | Cross-cut adhension test | 3 wt %-reduction temperature |
|---|---|---|---|---|---|---|
| Example I-31 | PAA2 | PPX | 1.0 | 5.1 | 0/100 | 485° C. |
| Example I-32 | PAA3 | BIX | 1.0 | 5.0 | 0/100 | 505° C. |
| Example I-33 | PAA3 | PPX | 1.0 | 5.0 | 0/100 | 505° C. |
| Example I-34 | PAA3 | PSC | 1.0 | 5.0 | 0/100 | 505° C. |
| Example I-35 | PAA4 | QNX | 1.0 | 5.0 | 0/100 | 490° C. |
| Example I-36 | PAA4 | IMX | 1.0 | 5.0 | 0/100 | 490° C. |
| Example I-37 | PAA4 | PPH | 1.0 | 5.0 | 0/100 | 490° C. |
| Example I-38 | PAA5 | PYX | 1.0 | 5.1 | 0/100 | 475° C. |
| Example I-39 | PAA5 | QNX | 1.0 | 5.1 | 0/100 | 475° C. |
| Example I-40 | PAA5 | PAH | 1.0 | 5.1 | 0/100 | 475° C. |

*)Molar ratio to the repeating unit of polyamic acid.

EXAMPLE II

In this example, the nitrogen-containing heterocyclic compounds represented by the aforementioned general formula (3) were employed as a photosensitive heat cure-accelerator to prepare positive photosensitive polymer compositions, and the characteristics of these polymer compositions were investigated. The nitrogen-containing heterocyclic compounds (PY1), (PY2), (PY3), (QN1) and (QN2) employed in this example as a photosensitive heat cure-accelerator are summarized as follows.

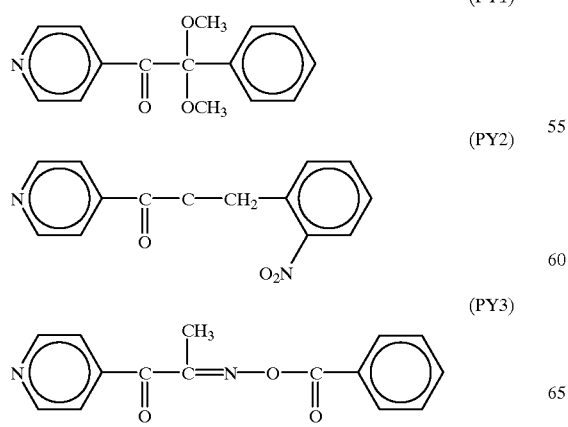

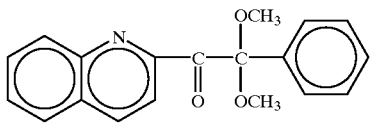

(QN1)

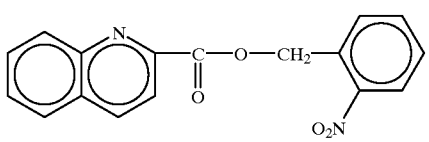

(QN2)

As shown in the following Tables 6 to 9, each solution of the polyamic acid synthesized in the aforementioned process was mixed with a photosensitive heat cure accelerator at a predetermined mixing ratio, and stirred at room temperature to obtain a homogeneous solution. The mixed solution was then filtered with a membrane filter having a pore size of 0.5 μm, thereby to prepare the photosensitive polymer compositions of this invention (Examples II-1 to II-30).

The patterning of resin layer was performed by making use of these photosensitive polymer compositions under the same conditions as mentioned above for the purpose of investigating the resolution of these polymer compositions, the results being shown in the following Tables 6 and 7. Furthermore, polyimide films were formed to evaluate the adhesivity and heat resistance of these polymer compositions in the same manner as explained above, the results being shown in the following Tables 8 and 9.

TABLE 6

|  | Polyamic acid | Photosensitive cure-accelerator | amount*) | Film thickness ($\mu$m) | Exposure dose (mJ/cm$^2$) | Resolution ($\mu$m) |
| --- | --- | --- | --- | --- | --- | --- |
| Example II-1 | PAA1 | PY1 | 1.0 | 5.0 | 300 | 3.0 |
| Example II-2 | PAA1 | PY2 | 1.0 | 5.0 | 200 | 3.0 |
| Example II-3 | PAA1 | PY3 | 1.0 | 5.0 | 300 | 3.5 |
| Example II-4 | PAA1 | QN1 | 1.0 | 5.0 | 300 | 3.0 |
| Example II-5 | PAA1 | QN2 | 1.0 | 5.0 | 200 | 3.0 |
| Example II-6 | PAA2 | PY1 | 1.0 | 5.1 | 300 | 3.0 |
| Example II-7 | PAA2 | PY2 | 1.0 | 5.1 | 200 | 3.0 |

*)Molar ratio to the repeating unit of polyamic acid.

TABLE 7

|  | Polyamic acid | Photosensitive cure-accelerator | amount*) | Film thickness ($\mu$m) | Exposure dose (mJ/cm$^2$) | Resolution ($\mu$m) |
| --- | --- | --- | --- | --- | --- | --- |
| Example II-8 | PAA2 | PY3 | 1.0 | 5.1 | 300 | 3.5 |
| Example II-9 | PAA2 | QN1 | 1.0 | 5.1 | 300 | 3.0 |
| Example II-10 | PAA2 | QN2 | 1.0 | 5.1 | 200 | 3.0 |
| Example II-11 | PAA3 | PY1 | 1.0 | 5.0 | 300 | 3.0 |
| Example II-12 | PAA3 | PY2 | 1.0 | 5.0 | 200 | 3.0 |
| Example II-13 | PAA3 | PY3 | 1.0 | 5.0 | 300 | 3.5 |
| Example II-14 | PAA3 | QN1 | 1.0 | 5.0 | 300 | 3.0 |
| Example II-15 | PAA3 | QN2 | 1.0 | 5.0 | 200 | 3.0 |

*)Molar ratio to the repeating unit of polyamic acid.

TABLE 8

|  | Polyamic acid | Photosensitive cure-accelerator | amount*) | Film thickness ($\mu$m) | Cross-cut adhension test | 3 wt %-reduction temperature |
| --- | --- | --- | --- | --- | --- | --- |
| Example II-16 | PAA1 | PY1 | 1.0 | 5.0 | 0/100 | 505° C. |
| Example II-17 | PAA1 | PY2 | 1.0 | 5.0 | 0/100 | 505° C. |
| Example II-18 | PAA1 | PY3 | 1.0 | 5.0 | 0/100 | 505° C. |
| Example II-19 | PAA1 | QN1 | 1.0 | 5.0 | 0/100 | 505° C. |
| Example II-20 | PAA1 | QN2 | 1.0 | 5.0 | 0/100 | 505° C. |
| Example II-21 | PAA2 | PY1 | 1.0 | 5.1 | 0/100 | 485° C. |
| Example II-22 | PAA2 | PY2 | 1.0 | 5.1 | 0/100 | 485° C. |

*)Molar ratio to the repeating unit of polyamic acid.

TABLE 9

|  | Polyamic acid | Photosensitive cure-accelerator | amount*) | Film thickness ($\mu$m) | Cross-cut adhension test | 3 wt %-reduction temperature |
| --- | --- | --- | --- | --- | --- | --- |
| Example II-23 | PAA2 | PY3 | 1.0 | 5.1 | 0/100 | 485° C. |
| Example II-24 | PAA2 | QN1 | 1.0 | 5.1 | 0/100 | 485° C. |
| Example II-25 | PAA2 | QN2 | 1.0 | 5.1 | 0/100 | 485° C. |
| Example II-26 | PAA3 | PY1 | 1.0 | 5.0 | 0/100 | 505° C. |
| Example II-27 | PAA3 | PY2 | 1.0 | 5.0 | 0/100 | 505° C. |
| Example II-28 | PAA3 | PY3 | 1.0 | 5.0 | 0/100 | 505° C. |
| Example II-29 | PAA3 | QN1 | 1.0 | 5.0 | 0/100 | 505° C. |
| Example II-30 | PAA3 | QN2 | 1.0 | 5.0 | 0/100 | 505° C. |

*)Molar ratio to the repeating unit of polyamic acid.

EXAMPLE III

In this example, substituted or unsubstituted fused cyclic or unfused cyclic pyridinequinone diazide compounds or quinolinequinone diazide compounds were employed as a photosensitive heat cure-accelerator to prepare positive photosensitive polymer compositions, and the characteristics of these polymer compositions were investigated. The codes for these cure-accelerators employed in this example represent the following compounds.

QNQD: quinoline-3,4-quinone-3-diazide
7PQD: 7-phenylquinoline-3,4-quinone-3-diazide
DMQD: 5,8-dimethoxyquinoline-3,4-quinone-3-diazide
2HQD: 2-hydroxyquinoline-3,4-quinone-3-diazide
BQQD: benzo[g]quinoline-3,4-quinone-3-diazide As shown in the following Tables 10 to 13, each solution of the polyamic acid synthesized in the aforementioned process was mixed with a photosensitive heat cure accelerator at a predetermined mixing ratio, and stirred at room temperature to obtain a homogeneous solution. The mixed solution was then filtered with a membrane filter having a pore size of 0.5 $\mu$m, thereby to prepare the photosensitive polymer compositions of this invention (Examples III-1 to III-30).

The patterning of resin layer was performed by making use of the photosensitive polymer compositions under the same conditions as mentioned above for the purpose of investigating the resolution of these polymer compositions, the results being shown in the following Tables 10 and 11. Furthermore, polyimide films were formed to evaluate the adhesivity and heat resistance of these polymer compositions in the same manner as explained above, the results being shown in the following Tables 12 and 13.

TABLE 10

| | Polyamic acid | Photosensitive cure-accelerator | amount*) | Film thickness ($\mu$m) | Exposure dose (mJ/cm$^2$) | Resolution ($\mu$m) |
| --- | --- | --- | --- | --- | --- | --- |
| Example III-1 | PAA1 | QNQD | 1.0 | 5.0 | 300 | 3.0 |
| Example III-2 | PAA1 | 7PQD | 1.0 | 5.0 | 200 | 2.5 |
| Example III-3 | PAA1 | DMQD | 1.0 | 5.0 | 150 | 2.0 |
| Example III-4 | PAA1 | 2HQD | 1.0 | 5.0 | 150 | 2.0 |
| Example III-5 | PAA1 | BQQD | 1.0 | 5.0 | 150 | 2.5 |
| Example III-6 | PAA2 | DMQD | 1.0 | 5.1 | 400 | 2.0 |
| Example III-7 | PAA2 | 2HQD | 1.0 | 5.1 | 400 | 2.0 |
| Example III-8 | PAA2 | BQQD | 1.0 | 5.1 | 400 | 2.5 |

*)Molar ratio to the repeating unit of polyamic acid.

TABLE 11

| | Polyamic acid | Photosensitive cure-accelerator | amount*) | Film thickness ($\mu$m) | Exposure dose (mJ/cm$^2$) | Resolution ($\mu$m) |
| --- | --- | --- | --- | --- | --- | --- |
| Example III-9 | PAA3 | DMQD | 1.0 | 5.0 | 300 | 2.0 |
| Example III-10 | PAA3 | 2HQD | 1.0 | 5.0 | 300 | 2.0 |
| Example III-11 | PAA3 | BQQD | 1.0 | 5.0 | 150 | 2.5 |
| Example III-12 | PAA4 | DMQD | 1.0 | 5.0 | 150 | 2.0 |
| Example III-13 | PAA4 | 2HQD | 1.0 | 5.0 | 400 | 2.0 |
| Example III-14 | PAA5 | DMQD | 1.0 | 5.1 | 400 | 2.0 |
| Example III-15 | PAA5 | 2HQD | 1.0 | 5.1 | 300 | 2.0 |

*)Molar ratio to the repeating unit of polyamic acid.

TABLE 12

| | Polyamic acid | Photosensitive cure-accelerator | amount*) | Film thickness ($\mu$m) | Cross-cut adhension test | 3 wt %-reduction temperature |
| --- | --- | --- | --- | --- | --- | --- |
| Example III-16 | PAA1 | QNQD | 1.0 | 5.0 | 0/100 | 505° C. |
| Example III-17 | PAA1 | 7PQD | 1.0 | 5.0 | 0/100 | 505° C. |
| Example III-18 | PAA1 | DMQD | 1.0 | 5.0 | 0/100 | 505° C. |
| Example III-19 | PAA1 | 2HQD | 1.0 | 5.0 | 0/100 | 505° C. |
| Example III-20 | PAA1 | BQQD | 1.0 | 5.0 | 0/100 | 505° C. |
| Example III-21 | PAA2 | DMQD | 1.0 | 5.1 | 0/100 | 485° C. |
| Example III-22 | PAA2 | 2HQD | 1.0 | 5.1 | 0/100 | 485° C. |
| Example III-23 | PAA2 | BQQD | 1.0 | 5.1 | 0/100 | 485° C. |

*)Molar ratio to the repeating unit of polyamic acid.

TABLE 13

|  | Polyamic acid | Photosensitive cure-accelerator | amount*) | Film thickness (μm) | Cross-cut adhension test | 3 wt %-reduction temperature |
|---|---|---|---|---|---|---|
| Example III-24 | PAA3 | DMQD | 1.0 | 5.0 | 0/100 | 505° C. |
| Example III-25 | PAA3 | 2HQD | 1.0 | 5.0 | 0/100 | 505° C. |
| Example III-26 | PAA3 | BQQD | 1.0 | 5.0 | 0/100 | 505° C. |
| Example III-27 | PAA4 | DMQD | 1.0 | 5.0 | 0/100 | 490° C. |
| Example III-28 | PAA4 | 2HQD | 1.0 | 5.0 | 0/100 | 490° C. |
| Example III-29 | PAA5 | DMQD | 1.0 | 5.1 | 0/100 | 475° C. |
| Example III-30 | PAA5 | 2HQD | 1.0 | 5.1 | 0/100 | 475° C. |

*)Molar ratio to the repeating unit of polyamic acid.

EXAMPLE IV

In this example, nitrogen-containing heterocyclic compounds where the hydroxy group of a substituted or unsubstituted fused cyclic or unfused cyclic 2-hydroxypyridine compound is substituted by a protective substituent group eliminable by the irradiation of light were employed as a photosensitive heat cure-accelerator to prepare positive photosensitive polymer compositions, and the characteristics of these polymer compositions were investigated. The codes for these cure-accelerators employed in this example represent the following compounds.

2NBP: 2-(2-nitrobenzyloxy) pyridine

2NBQ: 2-(2-nitrobenzyloxy) quinoline

1NBI: 1-(2-nitrobenzyloxy) isoquinoline

2DNP: 2-(2-diazo-1-naphthol-4-ylsulfonyloxy) pyridine

2DNQ: 2-(2-diazo-1-naphthol-4-ylsulfonyloxy) quinoline

NTFP: 5-nitro-2-(trifluoromethanesulfonyloxy) pyridine

2TFQ: 2-(trifluoromethanesulfonyloxy) quinoline

1TFI: 1-(trifluoromethanesulfonyloxy) isoquinoline

As shown in the following Tables 14 to 17, each solution of the polyamic acid synthesized in the aforementioned process was mixed with a photosensitive heat cure accelerator at a predetermined mixing ratio, and stirred at room temperature to obtain a homogeneous solution. The mixed solution was then filtered with a membrane filter having a pore size of 0.5 μm, thereby to prepare the photosensitive polymer compositions of this invention (Examples IV-1 to IV-40).

The patterning of resin layer was performed by making use of the photosensitive polymer compositions under the same conditions as mentioned above for the purpose of investigating the resolution of these polymer compositions, the results being shown in the following Tables 14 and 15. Furthermore, polyimide films were formed to evaluate the adhesivity and heat resistance of these polymer compositions in the same manner as explained above, the results being shown in the following Tables 16 and 17.

TABLE 14

|  | Polyamic acid | Photosensitive cure-accelerator | amount*) | Film thickness (μm) | Exposure dose (mJ/cm$^2$) | Resolution (μm) |
|---|---|---|---|---|---|---|
| Example IV-1 | PAA1 | 2NBP | 1.0 | 5.0 | 400 | 3.0 |
| Example IV-2 | PAA1 | 2NBQ | 1.0 | 5.0 | 300 | 2.5 |
| Example IV-3 | PAA1 | 1NBI | 1.0 | 5.0 | 300 | 2.5 |
| Example IV-4 | PAA1 | 2DNP | 1.0 | 5.0 | 150 | 2.0 |
| Example IV-5 | PAA1 | 2DNQ | 1.0 | 5.0 | 150 | 2.0 |
| Example IV-6 | PAA1 | NTFP | 1.0 | 5.0 | 400 | 2.5 |
| Example IV-7 | PAA1 | 2TFQ | 1.0 | 5.0 | 400 | 2.5 |
| Example IV-8 | PAA1 | 1TFI | 1.0 | 5.0 | 400 | 2.5 |
| Example IV-9 | PAA3 | 2NBQ | 1.0 | 5.0 | 300 | 2.5 |
| Example IV-10 | PAA3 | 1NBI | 1.0 | 5.0 | 300 | 2.5 |

*)Molar ratio to the repeating unit of polyamic acid.

TABLE 15

|  | Polyamic acid | Photosensitive cure-accelerator | amount*) | Film thickness (μm) | Exposure dose (mJ/cm$^2$) | Resolution (μm) |
|---|---|---|---|---|---|---|
| Example IV-11 | PAA3 | 2DNP | 1.0 | 5.0 | 150 | 2.0 |
| Example IV-12 | PAA3 | 2DNQ | 1.0 | 5.0 | 150 | 2.0 |
| Example IV-13 | PAA3 | 2TFQ | 1.0 | 5.0 | 400 | 2.5 |
| Example IV-14 | PAA3 | 1TFI | 1.0 | 5.0 | 400 | 2.5 |
| Example IV-15 | PAA5 | 2NBQ | 1.0 | 5.1 | 300 | 2.5 |
| Example IV-16 | PAA5 | 1NBI | 1.0 | 5.1 | 300 | 2.5 |
| Example IV-17 | PAA5 | 2DNP | 1..0 | 5.1 | 150 | 2.0 |
| Example IV-18 | PAA5 | 2DNQ | 1.0 | 5.1 | 150 | 2.0 |

TABLE 15-continued

|  | Polyamic acid | Photosensitive cure-accelerator | amount*) | Film thickness ($\mu$m) | Exposure dose (mJ/cm$^2$) | Resolution ($\mu$m) |
| --- | --- | --- | --- | --- | --- | --- |
| Example IV-19 | PAA5 | 2TFQ | 1.0 | 5.1 | 400 | 2.5 |
| Example IV-20 | PAA5 | 1TFI | 1.0 | 5.1 | 400 | 2.5 |

*)Molar ratio to the repeating unit of polyamic acid.

TABLE 16

|  | Polyamic acid | Photosensitive cure-accelerator | amount*) | Film thickness ($\mu$m) | Cross-cut adhension test | 3 wt %-reduction temperature |
| --- | --- | --- | --- | --- | --- | --- |
| Example IV-21 | PAA1 | 2NBP | 1.0 | 5.0 | 0/100 | 505° C. |
| Example IV-22 | PAA1 | 2NBQ | 1.0 | 5.0 | 0/100 | 505° C. |
| Example IV-23 | PAA1 | 1NBI | 1.0 | 5.0 | 0/100 | 505° C. |
| Example IV-24 | PAA1 | 2DNP | 1.0 | 5.0 | 0/100 | 505° C. |
| Example IV-25 | PAA1 | 2DNQ | 1.0 | 5.0 | 0/100 | 505° C. |
| Example IV-26 | PAA1 | NTFP | 1.0 | 5.0 | 0/100 | 505° C. |
| Example IV-27 | PAA1 | 2TFQ | 1.0 | 5.0 | 0/100 | 505° C. |
| Example IV-28 | PAA1 | 1TFI | 1.0 | 5.0 | 0/100 | 505° C. |
| Example IV-29 | PAA3 | 2NBQ | 1.0 | 5.0 | 0/100 | 505° C. |
| Example IV-30 | PAA3 | 1NBI | 1.0 | 5.0 | 0/100 | 505° C. |

*)Molar ratio to the repeating unit of polyamic acid.

TABLE 17

|  | Polyamic acid | Photosensitive cure-accelerator | amount*) | Film thickness ($\mu$m) | Cross-cut adhension test | 3 wt %-reduction temperature |
| --- | --- | --- | --- | --- | --- | --- |
| Example IV-31 | PAA3 | 2DNP | 1.0 | 5.0 | 0/100 | 505° C. |
| Example IV-32 | PAA3 | 2DNQ | 1.0 | 5.0 | 0/100 | 505° C. |
| Example IV-33 | PAA3 | 2TFQ | 1.0 | 5.0 | 0/100 | 505° C. |
| Example IV-34 | PAA3 | 1TFI | 1.0 | 5.0 | 0/100 | 505° C. |
| Example IV-35 | PAA5 | 2NBQ | 1.0 | 5.1 | 0/100 | 475° C. |
| Example IV-36 | PAA5 | 1NBI | 1.0 | 5.1 | 0/100 | 475° C. |
| Example IV-37 | PAA5 | 2DNP | 1.0 | 5.1 | 0/100 | 475° C. |
| Example IV-38 | PAA5 | 2DNQ | 1.0 | 5.1 | 0/100 | 475° C. |
| Example IV-39 | PAA5 | 2TFQ | 1.0 | 5.1 | 0/100 | 475° C. |
| Example IV-40 | PAA5 | 1TFI | 1.0 | 5.1 | 0/100 | 475° C. |

*)Molar ratio to the repeating unit of polyamic acid.

On the other hand, photosensitive polymer compositions of Comparative Examples 1 to 5 were prepared without adding any of the photosensitive heat cure accelerators, and the patterning of resin layer was performed by making use of these photosensitive polymer compositions under the same conditions as mentioned above to investigate the resolution of these polymer compositions, the results being shown in the following Table 18.

TABLE 18

|  | Polyamic acid | Photosensitive cure-accelerator | amount*) | Film thickness ($\mu$m) | Exposure dose (mJ/cm$^2$) | Resolution ($\mu$m) |
| --- | --- | --- | --- | --- | --- | --- |
| Comparative example 1 | PAA1 | None | — | 5.0 | 1000 | X |
| Comparative example 2 | PAA2 | None | — | 5.1 | 1000 | X |
| Comparative example 3 | PAA3 | None | — | 5.0 | 1000 | X |
| Comparative example 4 | PAA4 | None | — | 5.0 | 1000 | X |
| Comparative example 5 | PAA5 | None | — | 5.1 | 1000 | X |

Additionally, polyimide films were formed under a high temperature heating process (one hour at 150° C., one hour at 250° C. and one hour at 350° C.) to investigate the adhesivity and heat resistance of the polymer compositions in the same manner as explained above, the results being shown in the following Table 19 as Comparative Examples 6 to 10.

TABLE 19

|  | Polyamic acid | Photosensitive cure-accelerator | amount | Film thickness (μm) | Exposure dose (mJ/cm²) | Cross-cut adhension test | 3 wt %-reduction temperature |
|---|---|---|---|---|---|---|---|
| Comparative Example 6 | PAA1 | None | — | — | — | 0/100 | 505° C. |
| Comparative Example 7 | PAA2 | None | — | — | — | 0/100 | 485° C. |
| Comparative Example 8 | PAA3 | None | — | — | — | 0/100 | 505° C. |
| Comparative Example 9 | PAA4 | None | — | — | — | 0/100 | 490° C. |
| Comparative Example 10 | PAA5 | None | — | — | — | 0/100 | 475° C. |

As seen from the results shown above, the photosensitive polymer compositions of this invention containing a photosensitive heat cure accelerator which can be eliminated of its heat cure-accelerating property as it is irradiated with light were all capable of forming an excellent positive pattern of line-and-space having line width of 2.0 to 3.5 μm with an exposure dose of 150 to 400 mJ/cm², thus suggesting that the photosensitive polymer compositions are useful for forming a passivation film or wiring-insulation film with high resolution.

Moreover, the polyimide films that were formed with the photosensitive polymer compositions according to this invention indicated no phenomenon of peeling, thus indicating an excellent adhesivity between the polyimide film and the silicon wafer. Additionally, the polyimide film formed by making use of the photosensitive polymer composition of this invention exhibited no weight reduction, that might be resulted from thermal decomposition of resin, even if it is heated up to 450° C., thus demonstrating a high heat resistance of the polyimide film that is comparable to the polyimide film of Comparative Examples 6 to 10 which were prepared according to a high temperature process.

By contrast, the resin compositions (Comparative Examples 1 to 5) which included no photosensitive heat cure accelerator were incapable of forming a pattern at all even if they were irradiated with an exposure dose of 1,000 mJ/cm².

Next, a polyimide film pattern which was obtained by patterning a resin film formed by making use of a positive photosensitive polymer composition of this invention was employed for the manufacture of various kinds of electronic parts as shown in FIGS. 1 to 4.

FIG. 1 illustrates a cross-sectional view of a semiconductor device provided with a passivation film which was formed making use of a polymer composition of this invention. In this case, the photosensitive polymer composition of Example III-14 was employed for forming a patterned polyimide film to be utilized as a passivation film.

First of all, the photosensitive polymer composition was coated on the surface of a silicon substrate (wafer) bearing thereon a pnp type transistor on which a thermal oxide film and electrodes were formed. The coated layer was prebaked for 10 minutes at a temperature of 90° C. to obtain a resin layer having a film thickness of about 10 μm. Subsequently, the resin layer was exposed through a resolution-testing quartz mask to the irradiation of light at a dose of 300 mJ/cm² by making use of a light exposure apparatus (PLA-501FA, Canon Co.).

After this light exposure, the aforementioned silicon substrate was heated for 5 minutes on a hot plate heated up to 140° C., thereby heating the resin layer. Then, the silicon substrate was dipped into an alkaline developing solution (a 1.19 wt % aqueous solution of tetramethylammonium hydroxide) for 120 seconds thereby allowing the exposure portions of the resin layer to be selectively dissolved and removed. Thereafter, the resin layer was rinsed with water for 20 seconds. Finally, the pattern thus obtained was heat-treated for 30 minutes on the hot plate heated to 250° C., thereby obtaining a polyimide film pattern.

Referring to FIG. 1, a bonding pad 12 is formed on an LSI chip 11 mounted on a tab 13, and a passivation film 15 consisting of a patterned polyimide film is superimposed thereon. The bonding pad 12 formed on the LSI chip 11 is connected via a bonding wire 16 to a lead frame 17. Furthermore, these members are entirely encapsulated with a sealing agent 18.

When a passivation film 15 consisting of a patterned polyimide film formed from a photosensitive polymer composition of this invention is employed in the manufacture of a semiconductor element, it is possible to obtain a semiconductor element which is excellent in reliability while substantially preventing any defective product from being produced in the manufacturing steps. Moreover, since the conventional PEP step can be dispensed with, the manufacturing process would be simplified without giving rise to any problem involving safety, etc.

FIG. 2 illustrates a cross-sectional view showing a portion of a multi-chip module provided with an interlayer insulation film which was formed making use of a polymer composition of this invention. In this case, the photosensitive polymer composition of Example IV-4 was employed for forming a patterned polyimide film to be utilized as an interlayer insulation film, and the patterning of the polyimide film was carried out in the same manner as mentioned above.

Referring to FIG. 2, a thermal oxide film 22 is formed on the surface of a silicon substrate (wafer) 21. On this thermal oxide film 22, a copper wiring 23, an interlayer insulation film 24 consisting of a polyimide film, another copper wiring 25 and another interlayer insulation film 26 consisting of a polyimide film are successively superimposed. Furthermore, a contact hole is formed at a portion of the upper interlayer insulation film 26. A Pb/Sn electrode 27 connected to the copper wiring 23 and BLM (Ball Limiting Metallization) 28 are also formed.

Since the interlayer insulation film 24 can be formed by spin-coating a solution comprising a polyamic acid at first and then by curing the spin-coated layer, the stepped portion that might be formed due to the presence of the copper wiring can be greatly minimized, thus making it possible to flatten the surface of the device and to obtain a highly reliable wiring structure.

FIG. 3 illustrates a cross-sectional view showing an embedded optical waveguide provided with a core layer which was formed making use of a photosensitive polymer composition of this invention. In this case, the photosensitive polymer composition of Example II-12 was employed for forming a patterned polyimide film to be utilized as a core layer. In this case, the patterning of the polyimide film was carried out in the same manner as mentioned above.

Referring to FIG. 3, a lower clad layer 32 consisting of a heat-cured PAAL film is formed on the surface of a silicon substrate (wafer) 31. On this lower clad layer 32, a core layer 33 and an upper clad layer 34 consisting of a heat-cured PAAl film are successively superimposed.

Since the core layer 33 can be formed easily and precisely by making use of a photosensitive polymer composition of this invention, the conventional PEP step can be dispensed with, so that the productivity of the device can be greatly improved.

FIG. 4 illustrates a cross-sectional view showing a semiconductor element having a multilayered wiring structure provided with an interlayer insulation film which was formed making use of a polymer composition of this invention. In this case, the photosensitive polymer composition of Example I-5 was employed for forming a patterned polyimide film to be utilized as an interlayer insulation film. In this case, the patterning of the polyimide film was carried out in the same manner as mentioned above.

Referring to FIG. 4, a thermal oxide film 42 is formed on the surface of a silicon substrate (wafer) 41 bearing thereon an element region 47. A contact hole is formed at a portion of this thermal oxide film 42, and a first Al wiring 43 is formed over the contact hole. An interlayer insulation film 44 consisting of a polyimide film is superimposed on this first Al wiring 43. Furthermore, another contact hole is formed at a portion of the interlayer insulation film 44, and a second Al wiring 45 connected to the first Al wiring 43 is formed over the latter contact hole. On this second Al wiring 45 is further superimposed another interlayer insulation film 46.

Since the interlayer insulation film 44 can be formed by spin-coating a solution comprising a polyamic acid at first and then by curing the spin-coated layer, the stepped portion that might be formed can be greatly minimized, thus making it possible to form multi-layered Al wirings while maintaining the flatness of the surface of the device and to obtain a highly reliable wiring structure.

As explained above, since the photosensitive polymer composition of this invention is mixed therein with a specific kind of photosensitive heat cure accelerator, it is possible, with the employment of this photosensitive polymer composition, to form a fine pattern without requiring the employment of a photo-resist. Furthermore, since it is possible to perform the developing process of this photosensitive polymer composition by employing an aqueous alkaline solution, it is possible to obviate any problems involving safety and environmental pollution. It is also possible, with the employment of this photosensitive polymer composition, to provide a highly reliable electronic parts wherein a polymer film pattern excellent in resolution, heat resistance and adhesion is utilized as an insulating member, a passivation film member, a liquid crystal member or an optical waveguide member.

Therefore, the photosensitive polymer composition of this invention is quite useful as a wiring insulating film for an LSI, as a humidity resistant protecting film for an LSI, as an α-ray shielding film for an LSI, as a passivation film for a semiconductor device, as a wiring insulating film for a multi-chip module, as a wiring insulating film for a thin film magnetic head, as a wiring insulating film for a magnetic bubble memory, as an optical element or as an orienting film of liquid crystal display device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A positive photosensitive polymer composition, which comprises;

a thermosetting polymer precursor which can be cured through cyclodehydration upon heating; and a photosensitive cure accelerator which can be inactivated of its cure accelerating property by irradiation of light.

2. The positive photosensitive polymer composition according to claim 1, wherein said thermosetting polymer precursor which can be cured through cyclodehydration upon heating is a polyimide precursors having a repeating unit represented by the following general formula (1)

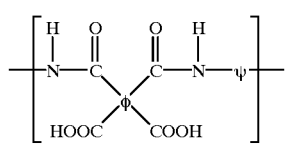

(1)

wherein φ is a quadrivalent organic group; and φ is a bivalent organic group.

3. The positive photosensitive polymer composition according to claim 1, wherein said photosensitive cure accelerator which can be inactivated of its cure accelerating property by irradiation of light is an azomethine compound represented by the following general formula (2)

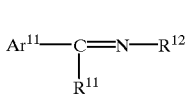

(2)

wherein $Ar^{11}$ is a substituted or unsubstituted nitrogen-containing aromatic heterocyclic group having pyridine type nuclear nitrogen atom (—N═) and a bonding hand extending from a nuclear carbon atom located next to the nuclear nitrongen atom; $R^{11}$ is a substituted or unsubstituted aromatic hydrocarbon group, heterocyclic group, aliphatic hydrocarbon group, alicyclic hydrocarbon group, acyl group or hydrogen atom; and $R^{12}$ is —OH, —NH—$R^{13}$ (where $R^{13}$ is a substituted or unsubstituted aromatic hydrocarbon group, heterocyclic group, aliphatic hydrocarbon group, alicyclic hydrocarbon group, acyl group, thioacyl group or carbamoyl group) or —COOH.

4. The positive photosensitive polymer composition according to claim 1, wherein said photosensitive cure accelerator which can be inactivated of its cure accelerating property by irradiation of light is a nitrogen-containing heterocyclic compound represented by the following general formula (3)

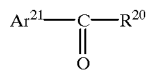

(3)

wherein $Ar^{21}$ is a substituted or unsubstituted nitrogen-containing aromatic heterocyclic group having pyridine type nuclear nitrogen atom (—N═); and $R^{20}$ is selected from the following groups (a-1) to (a-8)

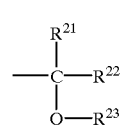 (a-1)

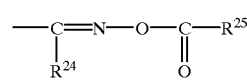 (a-2)

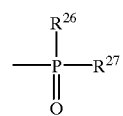 (a-3)

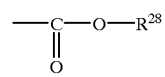 (a-4)

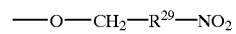 (a-5)

 (a-6)

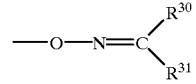 (a-7)

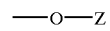 (a-8)

wherein $R^{21}$ and $R^{22}$ represent individually a substituted or unsubstituted aromatic hydrocarbon group, heterocyclic group, aliphatic hydrocarbon group, alicyclic hydrocarbon group, alkoxy group, hydroxy group or hydrogen atom ($R^{21}$ and $R^{22}$ may be bonded together to form an alicyclic hydrocarbon group); $R^{23}$, $R^{24}$, $R^{25}$, $R^{30}$ and $R^{31}$ represent individually a substituted or unsubstituted aromatic hydrocarbon group, heterocyclic group, aliphatic hydrocarbon group, alicyclic hydrocarbon group or hydrogen atom; $R^{26}$, $R^{27}$ and $R^{28}$ represent individually a substituted or unsubstituted aromatic hydrocarbon group, heterocyclic group, aliphatic hydrocarbon group or alicyclic hydrocarbon; $R^{29}$ represents a substituted or unsubstituted aromatic hydrocarbon group or aromatic heterocyclic group; X is a halogen; and Z is a cycloamino group.

5. The positive photosensitive polymer composition according to claim 1, wherein said photosensitive cure accelerator which can be inactivated of its cure accelerating property by irradiation of light is a substituted or unsubstituted fused cyclic or unfused cyclic pyridinequinone diazide compound or quinolinequinone diazide compound.

6. The positive photosensitive polymer composition according to claim 5, wherein said photosensitive cure accelerator which can be inactivated of its cure accelerating property by irradiation of light is at least one kind of compound selected from the group consisting of pyridine-3,4-quinone-3-diazide, quinoline-3,4-quinone-3-diazide, quinoline-3,4-quinone-4-diazide, quinoline-5,6-quinone-5-diazide, quinoline-5,6-quinone-6-diazide, quinoline-7,8-quinone-8-diazide, quinoline-7,8-quinone-7-diazide, benzo[f]quinoline-3,4-quinone-3-diazide, benzo[g]quinoline-3,4-quinone-3-diazide, and benzo[h]quinoline-3,4-quinone-3-diazide.

7. The positive photosensitive polymer composition according to claim 1, wherein said photosensitive cure accelerator which can be inactivated of its cure accelerating property by irradiation of light is a nitrogen-containing heterocyclic compound where the hydroxy group of a substituted or unsubstituted fused cyclic or unfused cyclic 2-hydroxypyridine compound is substituted by a protective substituent group which can be eliminated by the irradiation of light.

8. The positive photosensitive polymer composition according to claim 7, wherein said photosensitive cure accelerator which can be inactivated of its cure accelerating property by irradiation of light is at least one kind of compound selected from the group consisting of 2-hydroxypyridine, 2-hydroxyquinoline, 1-hydroxyisoquinoline, 3-hydroxyisoquinoline, 6-hydroxyphenanthridine, 2-hydroxybenzo[f]quinoline, 2-hydroxybenzo[g]quinoline, 2-hydroxybenzo[h]quinoline, 1-hydroxybenzo[f]isoquinoline, 1-hydroxybenzo[g]isoquinoline, 1-hydroxybenzo[h]isoquinoline, 3-hydroxybenzo[f]isoquinoline, 3-hydroxybenzo[g]isoquinoline, and 3-hydroxybenzo[h]isoquinoline.

9. The positive photosensitive polymer composition according to claim 1, wherein a mixing ratio of said photosensitive cure accelerator is within the range of 0.1 to 4.0 molar equivalent per mole of repeating unit of said thermosetting polymer precursor which can be cured through cyclodehydration upon heating.

10. The positive photosensitive polymer composition according to claim 9, wherein a mixing ratio of said photosensitive cure accelerator is within the range of 0.1 to 2.0 molar equivalent per mole of repeating unit of said thermosetting polymer precursor which can be cured through cyclodehydration upon heating.

11. The positive photosensitive polymer composition according to claim 2, wherein said photosensitive cure accelerator which can be inactivated of its cure accelerating property by irradiation of light is an azomethine compound represented by the following general formula (2)

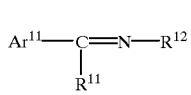

(2)

wherein $Ar^{11}$ is a substituted or unsubstituted nitrogen-containing aromatic heterocyclic group having pyridine type nuclear nitrogen atom (—N═) and a bonding hand extending from a nuclear carbon atom located next to the nuclear nitrongen atom; $R^{11}$ is a substituted or unsubstituted aromatic hydrocarbon group, heterocyclic group, aliphatic hydrocarbon group, alicyclic hydrocarbon group, acyl group or hydrogen atom; and $R^{12}$ is —OH, —NH—$R^{13}$ (where $R^{13}$ is a substituted or unsubstituted aromatic hydrocarbon group, heterocyclic group, aliphatic hydrocarbon group, alicyclic hydrocarbon group, acyl group, thioacyl group or carbamoyl group) or —COOH.

12. The positive photosensitive polymer composition according to claim 2, wherein said photosensitive cure accelerator which can be inactivated of its cure accelerating property by irradiation of light is a nitrogen-containing heterocyclic compound represented by the following general formula (3)

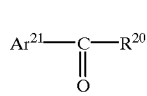

(3)

wherein $Ar^{21}$ is a substituted or unsubstituted nitrogen-containing aromatic heterocyclic group having pyridine type nuclear nitrogen atom (—N═); and $R^{20}$ is selected from the following groups (a-1) to (a-8)

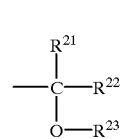

(a-1)

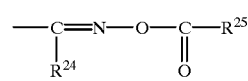

(a-2)

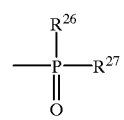

(a-3)

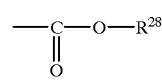

(a-4)

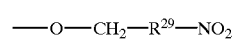

(a-5)

(a-6)

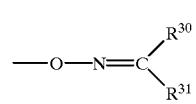

(a-7)

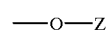

(a-8)

wherein $R^{21}$ and $R^{22}$ represent individually a substituted or unsubstituted aromatic hydrocarbon group, heterocyclic group, aliphatic hydrocarbon group, alicyclic hydrocarbon group, alkoxy group, hydroxy group or hydrogen atom ($R^{21}$ and $R^{22}$ may be bonded together to form an alicyclic hydrocarbon group); $R^{23}$, $R^{24}$, $R^{25}$, $R^{30}$ and $R^{31}$ represent individually a substituted or unsubstituted aromatic hydrocarbon group, heterocyclic group, aliphatic hydrocarbon group, alicyclic hydrocarbon group or hydrogen atom; $R^{26}$, $R^{27}$ and $R^{28}$ represent individually a substituted or unsubstituted aromatic hydrocarbon group, heterocyclic group, aliphatic hydrocarbon group or alicyclic hydrocarbon; $R^{29}$ represents a substituted or unsubstituted aromatic hydrocarbon group or aromatic heterocyclic group; X is a halogen; and Z is a cycloamino group.

13. The positive photosensitive polymer composition according to claim 2, wherein said photosensitive cure accelerator which can be inactivated of its cure accelerating property by irradiation of light is a substituted or unsubstituted fused cyclic or unfused cyclic pyridinequinone diazide compound or quinolinequinone diazide compound.

14. The positive photosensitive polymer composition according to claim 13, wherein said photosensitive cure accelerator which can be inactivated of its cure accelerating property by irradiation of light is at least one kind of compound selected from the group consisting of pyridine-3,4-quinone-3-diazide, quinoline-3,4-quinone-3-diazide, quinoline-3,4-quinone-4-diazide, quinoline-5,6-quinone-5-diazide, quinoline-5,6-quinone-6-diazide, quinoline-7,8-quinone-8-diazide, quinoline-7,8-quinone-7-diazide, benzo[f]quinoline-3,4-quinone-3-diazide, benzo[g]quinoline-3,4-quinone-3-diazide, and benzo[h]quinoline-3,4-quinone-3-diazide.

15. The positive photosensitive polymer composition according to claim 2, wherein said photosensitive cure accelerator which can be inactivated of its cure accelerating property by irradiation of light is a nitrogen-containing heterocyclic compound where the hydroxy group of a substituted or unsubstituted fused cyclic or unfused cyclic 2-hydroxypyridine compound is substituted by a protective substituent group which can be eliminated by the irradiation of light.

16. The positive photosensitive polymer composition according to claim 15, wherein said photosensitive cure accelerator which can be inactivated of its cure accelerating property by irradiation of light is at least one kind of compound selected from the group consisting of 2-hydroxypyridine, 2-hydroxyquinoline, 1-hydroxyisoquinoline, 3-hydroxyisoquinoline, 6-hydroxyphenanthridine, 2-hydroxybenzo[f]quinoline, 2-hydroxybenzo[g]quinoline, 2-hydroxybenzo[h]quinoline, 1-hydroxybenzo[f]isoquinoline, 1-hydroxybenzo[g]isoquinoline, 1-hydroxybenzo[h]isoquinoline, 3-hydroxybenzo[f]isoquinoline, 3-hydroxybenzo[g]isoquinoline, and 3-hydroxybenzo[h]isoquinoline.

17. The positive photosensitive polymer composition according to claim 2, wherein a mixing ratio of said photosensitive cure accelerator is within the range of 0.1 to 4.0 molar equivalent per mole of repeating unit of said thermosetting polymer precursor which can be cured through cyclodehydration upon heating.

18. The positive photosensitive polymer composition according to claim 17, wherein a mixing ratio of said photosensitive cure accelerator is within the range of 0.1 to 2.0 molar equivalent per mole of repeating unit of said thermosetting polymer precursor which can be cured through cyclodehydration upon heating.

19. A method of forming a pattern, which comprises the steps of;
coating the positive photosensitive polymer composition, which comprises a thermosetting polymer precursor which can be cured cyclodehydration upon heating and a photosensitive cure accelerator which can be inactivated of its cure accelerating property by irradiation of light, on a surface of a substrate;
forming a resin layer by heat-drying the coated photosensitive polymer composition at a temperature of not more than 180° C.;

irradiating light onto a predetermined region of said resin layer;

heat-treating said resin layer after the light-irradiating step at a temperature ranging from 50 to 200° C.; and developing the heat-treated resin layer by dissolving and removing a portion of said resin layer which is exposed to the light by making use of a developing solution.

20. An electronic part, which is provided with a polymer film functioning as an insulating film, a passivation film, an optical film or a liquid crystal orienting film, said polymer film being formed through a patterning method as recited in claim 19.

\* \* \* \* \*